United States Patent
Yoshioka et al.

(10) Patent No.: US 10,971,792 B2
(45) Date of Patent: Apr. 6, 2021

(54) FIRST AND SECOND DIELECTRIC WAVEGUIDES DISPOSED IN RESPECTIVE MULTI-LAYER SUBSTRATES WHICH ARE CONNECTED BY A CONNECTION STRUCTURE HAVING CHOKE STRUCTURES THEREIN

(71) Applicant: MITSUBISHI ELECTRIC CORPORATION, Tokyo (JP)

(72) Inventors: Hideharu Yoshioka, Tokyo (JP); Yasuo Morimoto, Tokyo (JP); Naofumi Yoneda, Tokyo (JP); Akimichi Hirota, Tokyo (JP); Tomokazu Hamada, Tokyo (JP); Tsuyoshi Hatate, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/483,143

(22) PCT Filed: Apr. 12, 2017

(86) PCT No.: PCT/JP2017/014997
§ 371 (c)(1),
(2) Date: Aug. 2, 2019

(87) PCT Pub. No.: WO2018/189834
PCT Pub. Date: Oct. 18, 2018

(65) Prior Publication Data
US 2020/0028228 A1    Jan. 23, 2020

(51) Int. Cl.
*H01P 5/08*    (2006.01)
*H01P 1/04*    (2006.01)
*H01P 1/162*   (2006.01)
*H01P 3/16*    (2006.01)
*H01P 5/02*    (2006.01)
*H01P 3/12*    (2006.01)

(52) U.S. Cl.
CPC .............. *H01P 5/087* (2013.01); *H01P 1/042* (2013.01); *H01P 1/162* (2013.01); *H01P 3/121* (2013.01); *H01P 3/16* (2013.01); *H01P 5/024* (2013.01)

(58) Field of Classification Search
CPC .......... H01P 3/121; H01P 1/042; H01P 5/087; H01P 5/024
USPC ....................................................... 333/254
See application file for complete search history.

(56) References Cited

U.S. PATENT DOCUMENTS

| | | | |
|---|---|---|---|
| 3,155,923 A | 11/1964 | Persson | |
| 6,515,562 B1* | 2/2003 | Takenoshita et al. | .. H01P 3/121 333/248 |
| 7,994,881 B2* | 8/2011 | Suzuki | ..................... H01P 1/042 333/254 |

FOREIGN PATENT DOCUMENTS

| | | |
|---|---|---|
| JP | 5094871 B2 | 12/2012 |
| JP | 5289401 B2 | 9/2013 |
| JP | 5349196 B2 | 11/2013 |

* cited by examiner

*Primary Examiner* — Benny T Lee
(74) *Attorney, Agent, or Firm* — Birch, Stewart, Kolasch & Birch, LLP

(57) ABSTRACT

Provided is a structure configured to electrically connect multi-layer dielectric waveguides, each including a dielectric waveguide formed of conductor patterns and vias in a laminating direction of the multi-layer dielectric substrate, in which the vias for forming part of a waveguide wall of each of the dielectric waveguides are arranged in a staggered pattern in the multi-layer dielectric substrate side having choke structures formed so as to electrically connect the waveguides to each other.

8 Claims, 19 Drawing Sheets

FIRST AND SECOND DIELECTRIC WAVEGUIDES DISPOSED IN RESPECTIVE MULTI-LAYER SUBSTRATES WHICH ARE CONNECTED BY A CONNECTION STRUCTURE HAVING CHOKE STRUCTURES THEREIN

TECHNICAL FIELD

The present invention relates to a connection structure for connection between dielectric substrates, each for forming a dielectric waveguide configured to propagate a high-frequency signal mainly in a microwave band and a millimeter wave band.

BACKGROUND ART

Hitherto, in transmission of a high-frequency signal between dielectric substrates, there is a known connection structure in which openings of dielectric waveguides respectively, formed in the dielectric substrates are opposed to each other in close proximity. In the connection structure described above, an electromagnetic wave leaks from a gap formed between the openings of the dielectric waveguides. Thus, a high-frequency transmission characteristic between the dielectric substrates and an isolation characteristic from a high-frequency transmission line adjacent thereto deteriorate.

Thus, in order to suppress the leakage of the electromagnetic wave from the gap formed between the openings of the dielectric waveguides, a choke structure including a first choke passage and a second choke passage extending from opening edges of the dielectric waveguides along the gap formed between the dielectric substrates is applied (see, for example, Patent Literature 1).

The first choke passage corresponds to a choke passage extending to a cutout, which is formed in a conductor provided on a surface of the dielectric substrate so as to be located at a position spaced by $\lambda e'/4$ away from the opening edge of the dielectric waveguide along the gap formed between the dielectric substrates, in which $\lambda e'$ is an effective wavelength in the gap.

The second choke passage corresponds to a choke passage having a length of $\lambda e/4$ from a position in the dielectric substrate, which corresponds to the cutout in a laminating direction, in a plane direction, in which $\lambda e$ is an effective wavelength in the dielectric substrate.

Further, hitherto, there is known a waveguide connection structure including a dielectric waveguide or a hollow waveguide formed of a dielectric substrate and a metal waveguide having a plate shape. The dielectric waveguide or the hollow waveguide and the metal waveguide are arranged in close proximity so that openings thereof are opposed to each other.

Even in the waveguide connection structure described above, choke structures are formed in the dielectric substrate so as to suppress the leakage of the electromagnetic wave from the gap formed between the opening of the dielectric waveguide or the hollow waveguide and the opening of the metal waveguide (see, for example, Patent Literature 2).

Further, in a related-art metal waveguide connection structure, there is a known choke structure including first choke passages and second choke passages formed along a gap formed between metals to extend from an aperture edge of the waveguide on a broad face side (see, for example, Patent Literature 3).

Each of the first choke passages corresponds to a choke from the aperture edge of the waveguide on the broad face side to a groove formed in a metal so as to be spaced by $\lambda/4$ away along the gap formed between the metals, in which $\lambda$ is a free space wavelength. Each of the second choke passages corresponds to a choke passage having a length of $\lambda/4$ in a depth direction from the groove.

Further, in a related-art hollow waveguide connection structure made of a metal, there is a known connection structure, in which inner waveguide horizontal and vertical dimensions of two waveguides provided in close proximity so as to be opposed to each other are set to different values (see, for example, Patent Literature 4).

CITATION LIST

Patent Literature

[PTL 1] JP 5349196 B2
[PTL 2] JP 5094871 B2
[PTL 3] U.S. Pat. No. 3,155,923 A
[PTL 4] JP 5289401 B2

SUMMARY OF THE INVENTION

Technical Problem

However, the related art has the following problems.

In the connection structure for dielectric waveguides, which is described in Patent Literature 1, a dielectric adhesive is applied between the dielectric substrates to fix the dielectric substrates adjacent to each other. Thus, it is difficult to separate the dielectric substrates from each other again.

The effects of a thickness error of a dielectric adhesive layer and a misalignment occurring at the time of bonding of the substrates is increased by a value of a square root of a specific dielectric constant of the dielectric adhesive as compared to a case in which air is present between the dielectric substrates. Thus, in the choke structure, an electrical length from the opening edge of the dielectric waveguide to the cutout formed in the conductor on the surface of the dielectric substrate does not become equal to $\lambda e/4$, which leads to deterioration of the characteristics.

Further, the waveguide connection structure described in Patent Literature 1 suppresses formation of the second choke passages in the choke structure along the laminating direction of the dielectric substrate so as to reduce a thickness of the connection structure for dielectric waveguides. When the second choke passages in the choke structure are formed sufficiently thin with respect to the wavelength along the laminating direction of the dielectric substrates, the second choke passage is required to be formed to have a length equal to $\lambda e/4$ in the plane direction of the dielectric substrate.

Thus, in the choke structure, the length from the opening edge of the dielectric waveguide in the plane direction of the dielectric substrate becomes equal to $(\lambda e'+\lambda e)/4$. Thus, when a similar waveguide connection structure is arranged adjacent thereto, a distance between the opening edge of the dielectric waveguide and the opening edge of the dielectric waveguide adjacent thereto is required to be $(\lambda e'+\lambda e)/2$ or larger. As a result, Patent Literature 1 has a problem in that an area of each of the dielectric substrates is increased.

In the waveguide connection structure described in Patent Literature 2, the choke structure includes the first choke passage formed to extend from the opening edge of the dielectric waveguide to the cutout, which is formed in the conductor on the surface of the dielectric substrate so as to be located at the position spaced by λ/4 away from the opening, along the gap formed between the dielectric substrates and the second choke passage having the length of λe/4 from the position in the dielectric substrate, which corresponds to the cutout in the laminating direction, in the plane direction.

However, when the second choke passage is to be formed sufficiently thin with respect to the wavelength in the laminating direction of the dielectric substrate, a distance from the opening edge of the dielectric waveguide to an end of the second choke passage on the dielectric waveguide side is only (λ−λe)/4. Thus, it becomes difficult to arrange vias to be used for a waveguide wall of the dielectric waveguide and vias to be used for the end of the second choke passage on the dielectric waveguide side at optimal positions. Thus, Patent Literature 2 has a problem in that the characteristics of the dielectric waveguide deteriorate.

In the waveguide connection structure described in Patent Literature 3, the choke structure has the grooves each having a U-shape with angled corners. However, when the second choke passage is to be formed sufficiently thin with respect to the wavelength in the laminating direction of the dielectric substrate, similarly to Patent Literature 2, a distance from the opening edge of the dielectric waveguide to an end of the second choke passage on the dielectric waveguide side is only (λ−λe)/4.

Thus, it becomes difficult to arrange vias to be used for a waveguide wall of the dielectric waveguide and vias to be used for the end of the second choke passage on the dielectric waveguide side at optimal positions. Thus, Patent Literature 3 has a problem in that the characteristics of the dielectric waveguide deteriorate.

Further, in the waveguide connection structure described in Patent Literature 4, the connection structure includes the two waveguides provided in close proximity so as to be opposed to each other, which have different inner waveguide horizontal and vertical dimensions. Different inner waveguide horizontal and vertical dimension ratios in the waveguides are equivalent to a state in which lines, each having a given electrical length and a different impedance, are connected to each other. Thus, even Patent Literature 4 has a problem in that the characteristics of the dielectric waveguide deteriorate.

In order to allow the misalignment occurring at the time of connection of the waveguides, it is conceivable to increase an inner waveguide dimensional ratio of the two waveguides. When the inner waveguide dimensional ratio is set too large, however, there arises a problem in that a loss which is not allowable may be generated even with no misalignment.

The present invention has been made to solve the problems described above, and has an object to provide a connection structure for dielectric waveguides, which has a small size and is suitable for a laminated structure, and has good reflection characteristic and passage characteristic in transmission of a high-frequency signal between dielectric substrates.

Solution to the Problem

According to one embodiment of the present invention, there is provided a connection structure for dielectric waveguides, including: a first multi-layer dielectric substrate, which includes a first dielectric waveguide having a first opening portion, and is configured to propagate a high-frequency signal therethrough; and a second multi-layer dielectric substrate, which includes a second dielectric waveguide having a second opening portion, is arranged to be opposed to the first multi-layer dielectric substrate so that the first opening portion and the second opening portion are opposed to each other through a first space therebetween, and is configured to propagate the high-frequency signal therethrough, wherein the first multi-layer dielectric substrate includes: a first surface-layer conductor, which is provided so as to cover a surface of the first multi-layer dielectric substrate, the surface being opposed to the second multi-layer dielectric substrate, has the first opening portion formed therethrough, and has first cutouts formed at two positions spaced by λ/4 away from edges of the first opening portion so as to be opposed to each other through the first opening portion therebetween; a first inner-layer conductor, which is provided in the first multi-layer dielectric substrate so as to be opposed to the first surface-layer conductor, and has a first conductor removed portion formed at a position opposed to the first opening portion; and a plurality of first conductor columns, which are provided to extend from the first surface-layer conductor through the first inner-layer conductor in a laminating direction of the first multi-layer dielectric substrate so as to surround the first opening portion, and are arranged so as to form a waveguide wall of the first dielectric waveguide, wherein the first multi-layer dielectric substrate has choke structures at two positions opposed to each other through the first opening portion therebetween, wherein the choke structures include first choke passages, each having a length of λ/4, and second choke passages, each having a length of λe/4, wherein each of the first choke passages is formed as a space from each of the edges of the first opening portion to a corresponding one of the first cutouts in the first space, wherein each of the second choke passages is formed as a space surrounded by a plurality of third conductor columns provided along an edge of each of the first cutouts, which is on a side opposite to a side on which the first dielectric waveguide is located, so as to connect the first surface-layer conductor and the first inner-layer conductor and the first conductor columns in a second space between the first surface-layer conductor and the first inner-layer conductor, wherein a part of the first conductor columns is arranged at a position spaced by λe/4 away from each of the first cutouts toward the first opening portion.

Advantageous Effects of the Invention

According to one embodiment of the present invention, in the structure configured to electrically connect the multi-layer dielectric substrates, each substrate including the dielectric waveguide formed of conductor patterns and vias in the laminating direction, the vias, which form part of the waveguide wall of the dielectric waveguide on the multi-layer dielectric substrate side in which the choke structures are formed, are arranged in a staggered pattern. With the configuration described above, an electrical length of each of the choke structures can be optimized, while the characteristics of the dielectric waveguides are maintained. As a result, the connection structure for dielectric waveguides, which has a small size and is suitable for a laminated structure, and has good reflection characteristic and passage characteristic in the transmission of the high-frequency signal between the dielectric substrates, can be provided.

DETAIL DESCRIPTION OF PREFERRED EMBODIMENTS

Referring to the accompanying drawings, a connection structure for dielectric waveguides according to an exemplary embodiment of the present invention is described below.

FIRST EMBODIMENT

Figure 1:
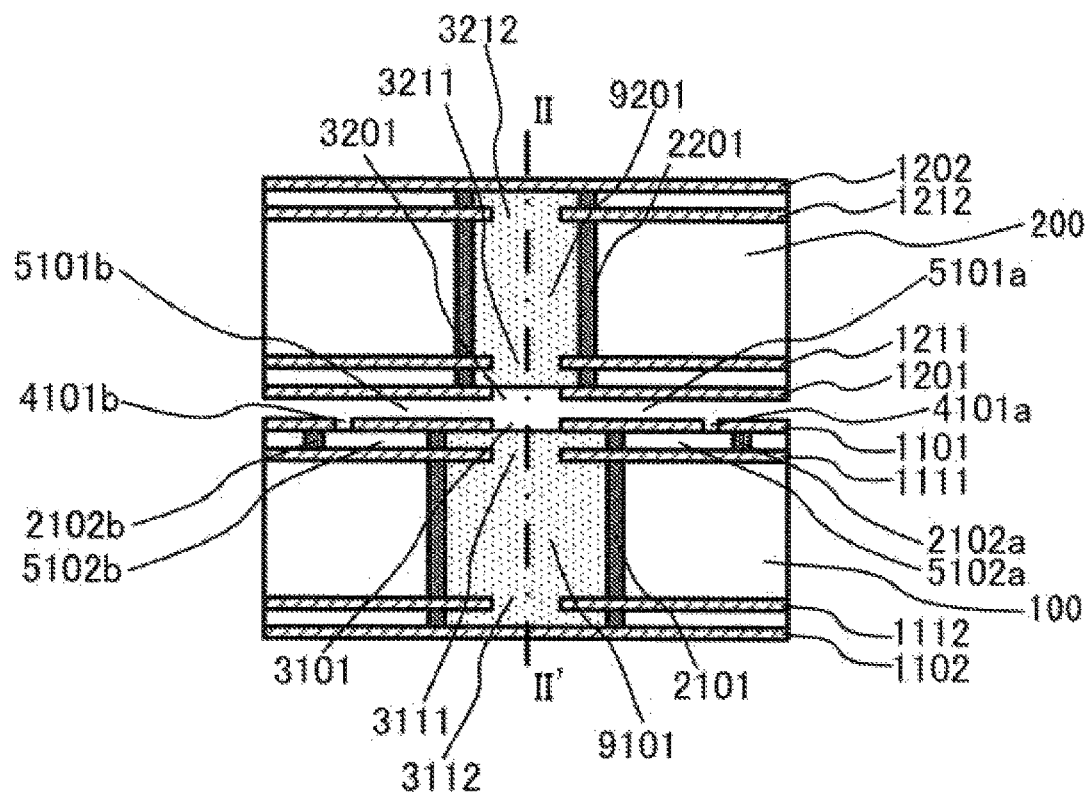
FIG. 1 is a longitudinal sectional view for illustrating a connection structure for dielectric waveguides according to a first embodiment of the present invention.
Figure 2:
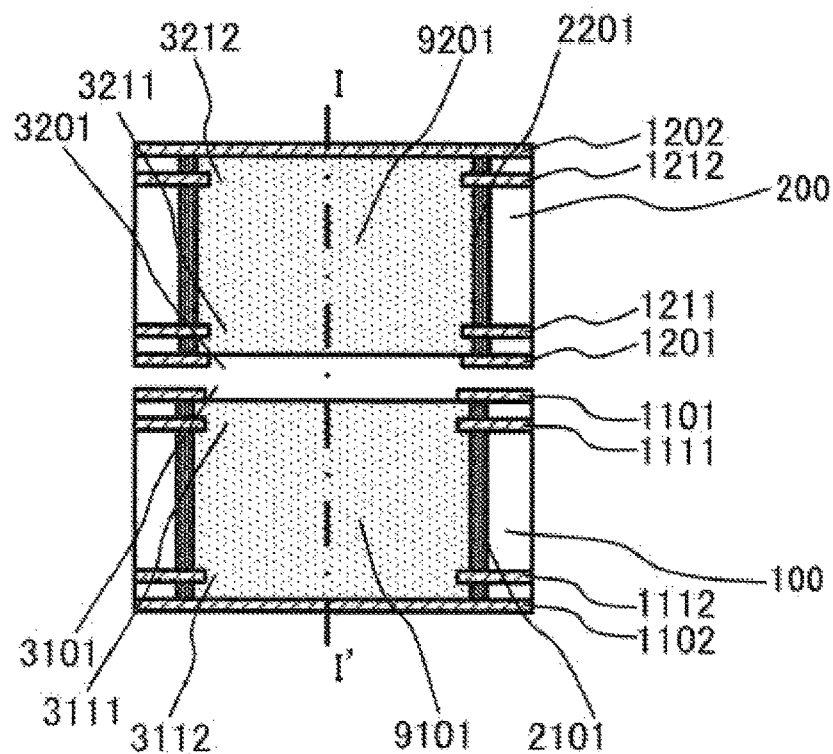
FIG. 2 is another longitudinal sectional view taken along the line II-II' of FIG. 1 in the first embodiment of the present invention.
Figure 3:
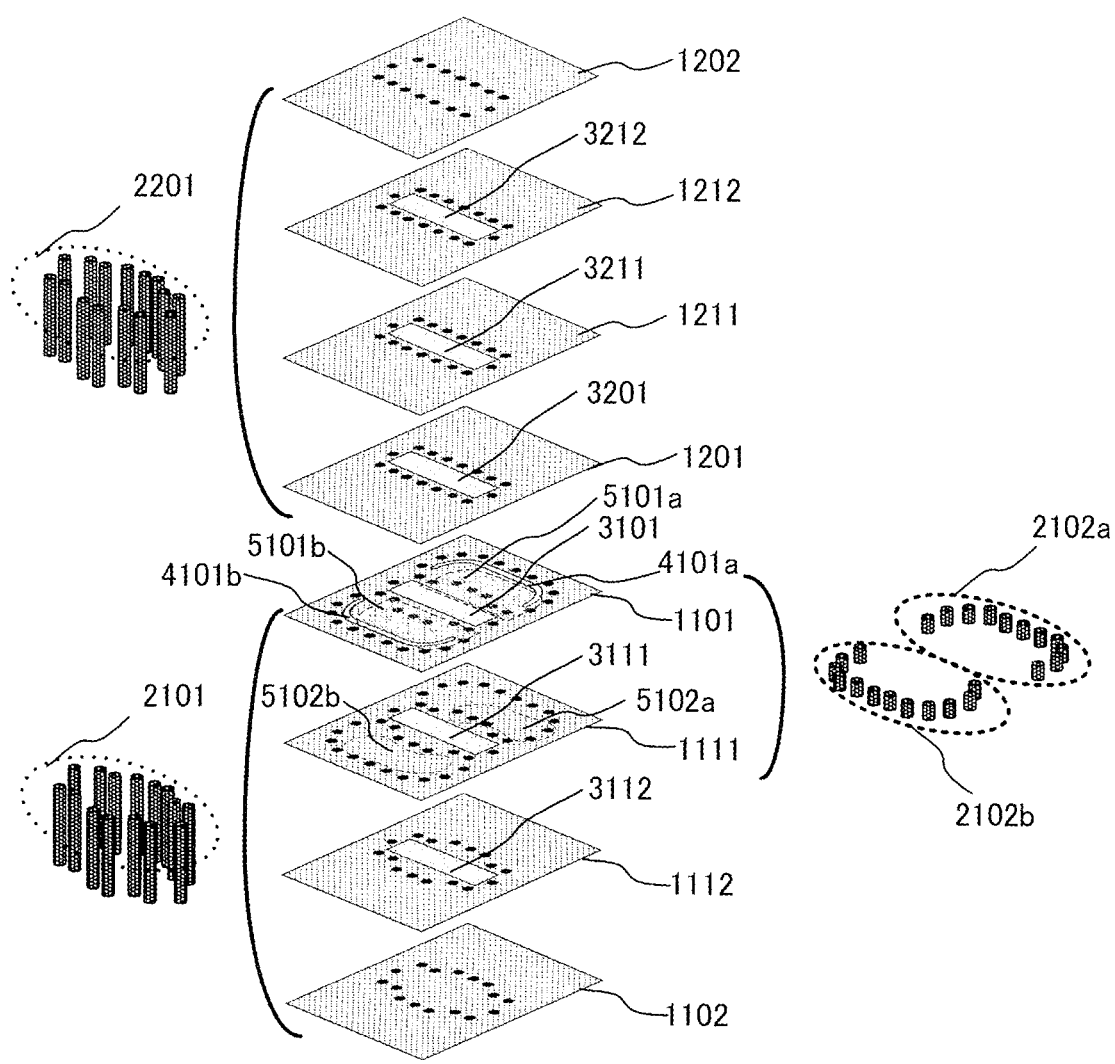
FIG. 3 is an exploded perspective view for illustrating conductor layers and conductor vias of FIG. 1 in the first embodiment of the present invention.

FIG. 1 is a longitudinal sectional view for illustrating a connection structure for dielectric waveguides according to a first embodiment of the present invention. FIG. 2 is another longitudinal sectional view taken along the line II-II' of FIG. 1 in the first embodiment of the present invention. Further, FIG. 3 is an exploded perspective view for illustrating conductor layers and conductor vias of FIG. 1 in the first embodiment of the present invention.

In the first embodiment, a structure configured to connect dielectric waveguides, each including surface-layer conductors, inner-layer conductors, and conductor vias mainly in a laminating direction of multi-layer dielectric substrates is specifically described. The labeled components of the first embodiment as illustrated in FIGS. 1-3 will be described in subsequent paragraphs of this application.

In FIG. 1, a multi-layer dielectric substrate 100 and a multi-layer dielectric substrate 200 are arranged in close proximity so as to be opposed to each other. A surface-layer conductor 1101 is arranged as a surface of the multi-layer dielectric substrate 100 on a side on which the multi-layer dielectric substrate 200 is arranged. A surface-layer conductor 1102 is arranged as a surface of the multi-layer dielectric substrate 100 on a side opposite to the side on which the multi-layer dielectric substrate 200 is arranged.

An inner-layer conductor 1111, an inner-layer conductor 1112, conductor vias 2101, conductor vias 2102a, and conductor vias 2102b are arranged between the surface-layer conductor 1101 and the surface-layer conductor 1102.

Part of the surface-layer conductor 1101 is removed to form an opening 3101. Part of the inner-layer conductor 1111 is removed to form a conductor removed portion 3111. Part of the inner-layer conductor 1112 is removed to form a conductor removed portion 3112.

A plurality of the conductor vias 2101 are arranged so as to surround the opening 3101 and pass through the multi-layer dielectric substrate 100, the inner-layer conductor 1111, and the inner-layer conductor 1112, which are located between the surface-layer conductor 1101 and the surface-layer conductor 1102.

In the laminating direction of the multi-layer dielectric substrate 100, there is formed a dielectric waveguide 9101 including the surface-layer conductor 1101, the surface-layer conductor 1102, the inner-layer conductor 1111, the inner-layer conductor 1112, the conductor vias 2101, the opening 3101, the conductor removed portion 3111, and the conductor removed portion 3112.

Meanwhile, a surface-layer conductor 1201 is arranged as a surface of the multi-layer dielectric substrate 200 on a side on which the multi-layer dielectric substrate 100 is arranged. A surface-layer conductor 1202 is arranged as a surface of the multi-layer dielectric substrate 200 on aside opposite to the side on which the multi-layer dielectric substrate 100 is arranged.

An inner-layer conductor 1211, an inner-layer conductor 1212, and conductor vias 2201 are arranged between the surface-layer conductor 1201 and the surface-layer conductor 1202.

Part of the surface-layer conductor 1201 is removed to form an opening 3201. Part of the inner-layer conductor 1211 is removed to form a conductor removed portion 3211. Part of the inner-layer conductor 1212 is removed to form a conductor removed portion 3212.

A plurality of the conductor vias 2201 are arranged so as to surround the opening 3201 and pass through the multi-layer dielectric substrate 200, the inner-layer conductor 1211, and the inner-layer conductor 1212, which are located between the surface-layer conductor 1201 and the surface-layer conductor 1202.

In the laminating direction of the multi-layer dielectric substrate 200, there is formed a dielectric waveguide 9201 including the surface-layer conductor 1201, the surface-layer conductor 1202, the inner-layer conductor 1211, the inner-layer conductor 1212, the conductor vias 2201, the opening 3201, the conductor removed portion 3211, and the conductor removed portion 3212.

A dielectric waveguide 9101 and a dielectric waveguide 9201 are arranged so that the opening 3101 of the dielectric waveguide 9101 and the opening 3201 of the dielectric waveguide 9201 are opposed to each other, and are electromagnetically connected to each other.

Portions of the surface-layer conductor 1101, which are located at positions spaced by $\lambda/4$ away from long-side edges of the opening 3101, are removed to form a cutout 4101a and a cutout 4101b. The cutout 4101a and the cutout 4101b are opposed to each other through the opening 3101 therebetween.

A plurality of the conductor vias 2102a are arranged along one of edges of the cutout 4101a, which is on the side opposite to the side on which the dielectric waveguide 9101 is located, to reach the vicinity of the conductor vias 2101 so as to connect the surface-layer conductor 1101 and the inner-layer conductor 1111.

A plurality of the conductor vias 2102b are arranged along one of edges of the cutout 4101b, which is on the side opposite to the side on which the dielectric waveguide 9101 is located, to reach the vicinity of the conductor vias 2101 so as to connect the surface-layer conductor 1101 and the inner-layer conductor 1111.

A choke passage 5101a is a space from one edge of the opening 3101 to the cutout 4101a within a space formed between the surface-layer conductor 1101 and the surface-layer conductor 1201.

A choke passage 5101b is a space from another edge of the opening 3101 to the cutout 4101b within a space formed between the surface-layer conductor 1101 and the surface-layer conductor 1201.

A choke passage 5102a is a space surrounded by the conductor vias 2102a and the conductor vias 2101 within a space formed between the surface-layer conductor 1101 and the inner-layer conductor 1111.

A choke passage 5102b is a space surrounded by the conductor vias 2102b and the conductor vias 2101 within a space formed between the surface-layer conductor 1101 and the inner-layer conductor 1111.

A part of the conductor vias 2101 is arranged at a position spaced by $\lambda e/4$ away from the cutout 4101a toward the opening 3101. Meanwhile, a part of the conductor vias 2101 is arranged at a position spaced by $\lambda e/4$ away from the cutout 4101b toward the opening 3101. As a result, the conductor vias 2101 are arranged in a staggered pattern.

Figure 4A:
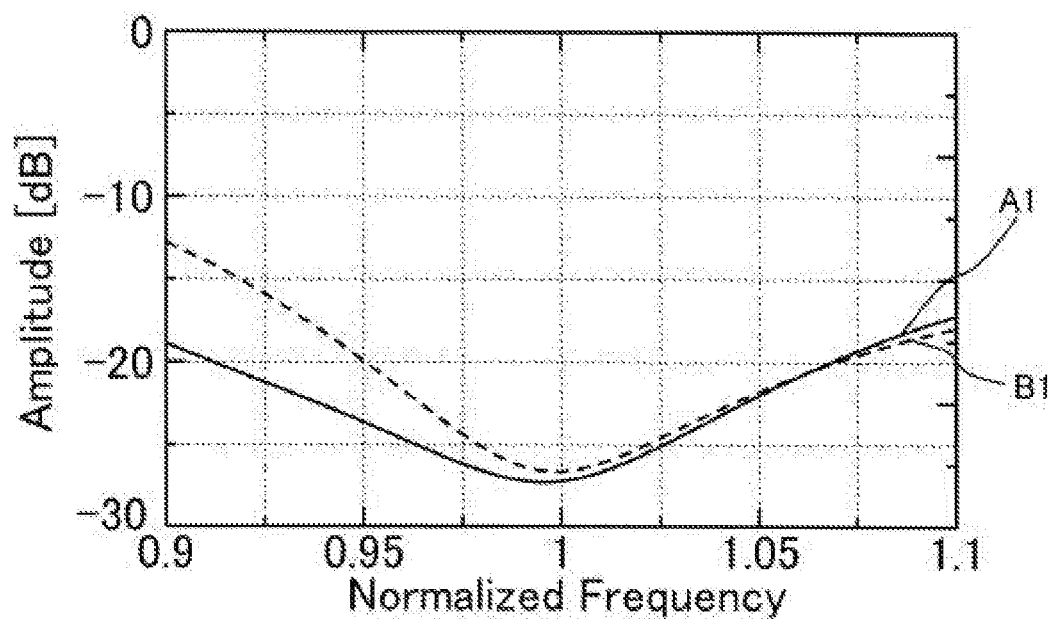
FIG. 4A is a graph for showing a result of simulation of a reflection characteristic for each of an example of a related-art connection structure for dielectric waveguides, in which vias for forming a dielectric waveguide wall are not arranged in a staggered pattern, and the connection structure for dielectric waveguides according to the first embodiment of the present invention.

FIG. 4A is a graph for showing a result of simulation of a reflection characteristic for each of an example of a related-art connection structure for dielectric waveguides, in which vias for forming a dielectric waveguide wall are not arranged in a staggered pattern, and the connection structure for dielectric waveguides according to the first embodiment of the present invention. In FIG. 4A, the graph comprises an X-axis defined by a Normalized Frequency and a Y-axis defined by Amplitude [dB]. A specific related-art connection structure for dielectric waveguides, which has a characteristic of FIG. 4A, is illustrated in FIG. 5A to FIG. 5D, which are referred to later.

Figure 4B:
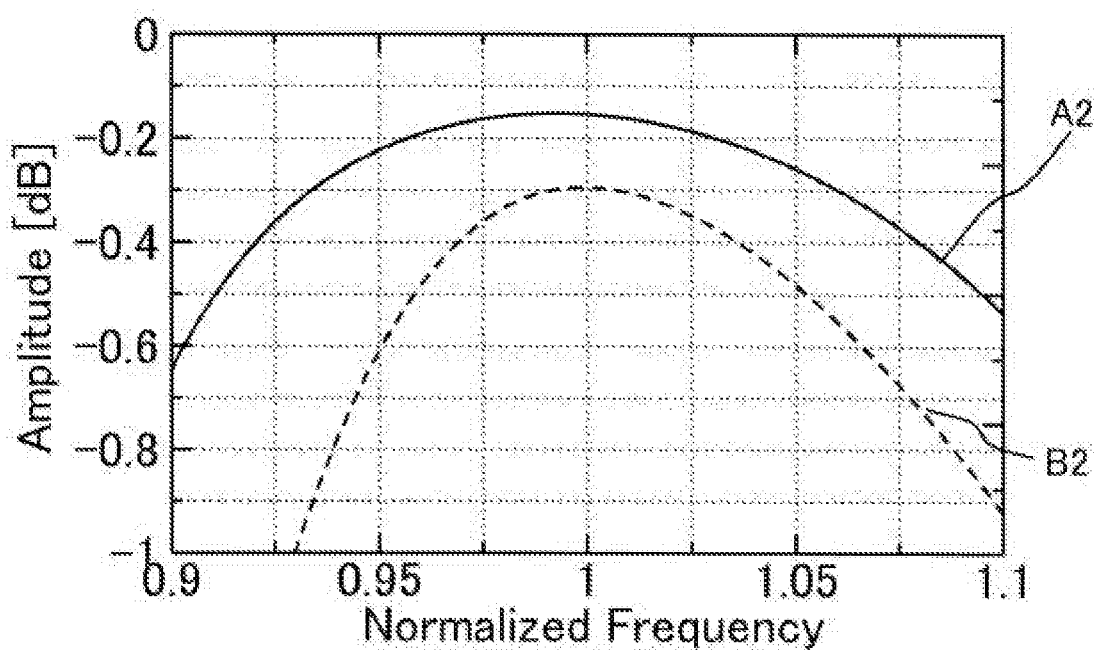
FIG. 4B is a graph for showing a result of simulation of a passage characteristic for each of the example of the related-art connection structure for dielectric waveguides, in which the vias for forming the dielectric waveguide wall are not arranged in a staggered pattern, and the connection structure for dielectric waveguides according to the first embodiment of the present invention.

Meanwhile, FIG. 4B is a graph for showing a result of simulation of a passage characteristic for each of an example of a related-art connection structure for dielectric waveguides, in which vias for forming a dielectric waveguide wall are not arranged in a staggered pattern, and the connection structure for dielectric waveguides according to the first embodiment of the present invention. In FIG. 4B, the graph comprises an X-axis defined by a Normalized Frequency and a Y-axis defined by Amplitude [dB]. A specific connection structure for dielectric waveguides according to the first embodiment, which has a characteristic of FIG. 4B, is illustrated in FIG. 6A to FIG. 6D, which are referred to later.

In the results of simulations shown in FIG. 4A and FIG. 4B, a high-frequency signal propagating from the conductor removed portion 3111 to the conductor removed portion 3211 in each of the example of the related-art connection structure for dielectric waveguides and the connection structure for dielectric waveguides according to the first embodiment is calculated. The reflection characteristic of FIG. 4A and the passage characteristic of FIG. 4B are both shown within a range of a fractional width of 20%.

In FIG. 4A, the reflection characteristic in the connection structure for dielectric waveguides according to the first embodiment is indicated by the solid line A1, whereas the reflection characteristic in the related-art connection structure for dielectric waveguides is indicated by the dotted line B1. In FIG. 4B, the passage characteristic in the connection structure for dielectric waveguides according to the first embodiment is indicated by the solid line A2, whereas the passage characteristic in the related-art connection structure for dielectric waveguides is indicated by the dotted line B2.

For example, in FIG. 4A, when focusing on the reflection characteristic at a normalized frequency of 1, it is understood that the result of simulation indicated by the dotted line B1 corresponding to the related-art connection structure for dielectric waveguides and the result of simulation indicated by the solid line A1 corresponding to the connection structure for dielectric waveguides according to the first embodiment are approximately equal to each other, and thus are about −27 dB.

Meanwhile, in FIG. 4B, when focusing on the passage characteristic at the normalized frequency of, for example, 1, it is understood that the result of simulation indicated by the solid line A2 corresponding to the connection structure for dielectric waveguides according to the first embodiment is improved by about 0.15 dB as compared to the dotted line B2 corresponding to the related-art connection structure for dielectric waveguides.

Specifically, a reflection amount is the same in the example of the related-art connection structure for dielectric waveguides and the connection structure for dielectric waveguides according to the first embodiment. For a passage amount, however, unnecessary emission of the high-frequency signal propagating from the conductor removed portion 3111 to the conductor removed portion 3211 is suppressed owing to the improvement of the connection structure for dielectric waveguides.

As is apparent from the results described above, the connection structure for dielectric waveguides in the first embodiment has such a configuration that a part of the conductor vias 2101 is arranged at the position spaced by λe/4 away from the cutout 4101*a* toward the opening 3101 and a part of the conductor vias 2101 is arranged at the position spaced by λe/4 away from the cutout 4101*b* toward the opening 3101 to arrange the conductor vias 2101 in the staggered pattern.

With the configuration described above, a length of the choke passage 5102*a* from the electrically short-circuited conductor via 2101 to the cutout 4101*a* becomes equal to λe/4. As a result, the cutout 4101*a* is electrically open.

Further, in the connection structure for dielectric waveguides in the first embodiment, a length of the choke passage 5101*a* from the cutout 4101*a*, which is electrically open, to the edge of the opening 3101 can be set to λ/4. Thus, the edge of the opening 3101 is electrically short-circuited.

Similarly, a length of the choke passage 5102*b* from the electrically short-circuited conductor via 2101 to the cutout 4101*b* can be set to λe/4. Thus, the cutout 4101*b* is electrically open.

Further, a length of the choke passage 5101*b* from the cutout 4101*b*, which is electrically open, to the edge of the opening 3101 can be set to λ/4. Thus, the edge of the opening 3101 is electrically short-circuited.

As a result, according to the first embodiment, leakage of the high-frequency signal from a space between the opening 3101 and the opening 3210 can be suppressed to provide the connection structure for dielectric waveguides, which has good reflection characteristic and passage characteristic.

Figure 5A:
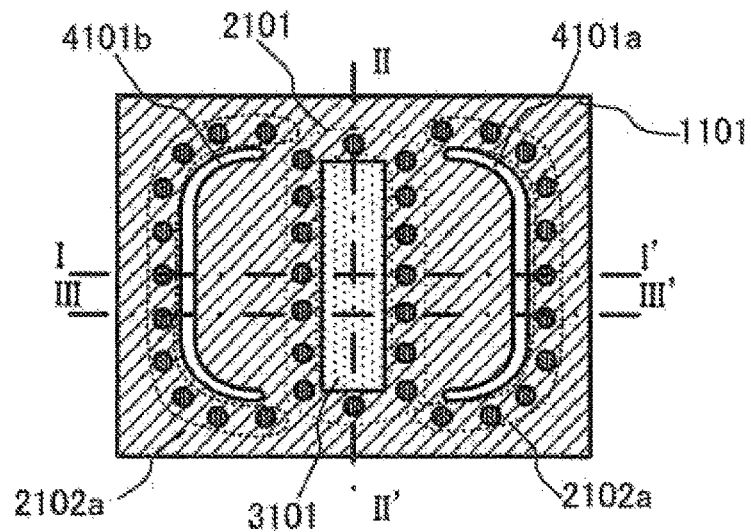
FIG. 5A is a top view for illustrating a connection structure for dielectric waveguides, which has related-art choke structures.
Figure 5B:
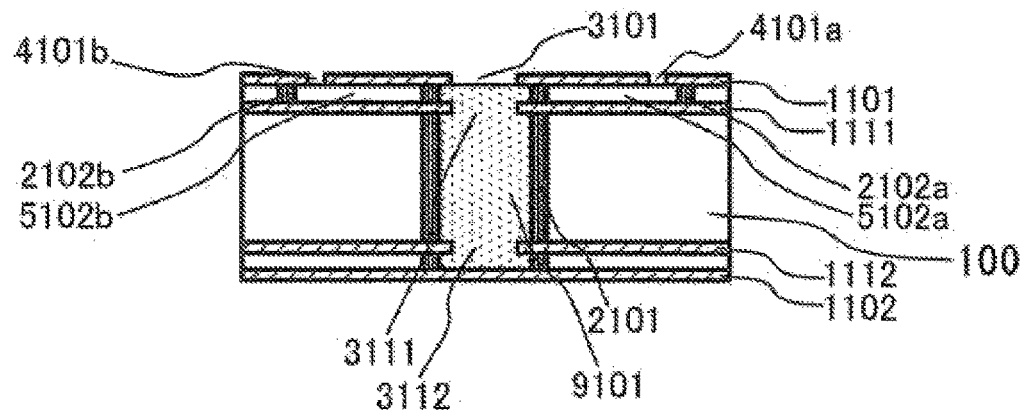
FIG. 5B is a longitudinal sectional view taken along the line I-I' of FIG. 5A.
Figure 5C:
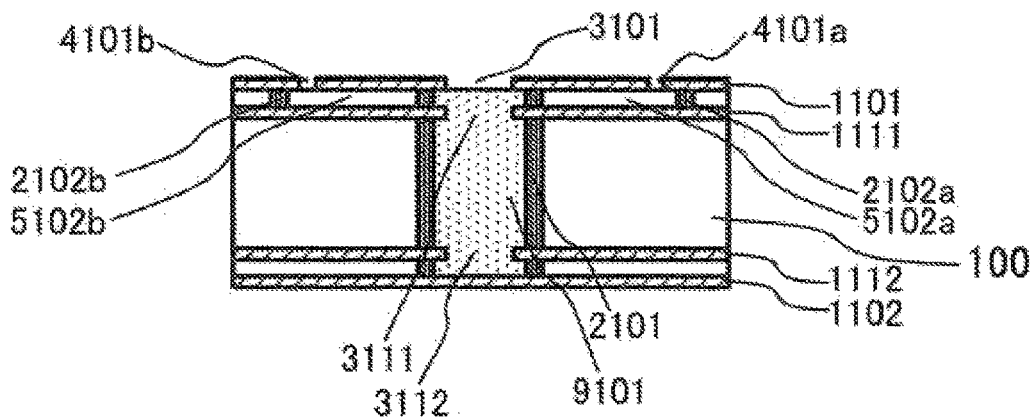
FIG. 5C is another longitudinal sectional view taken along the line III-III' of FIG. 5A.
Figure 5D:
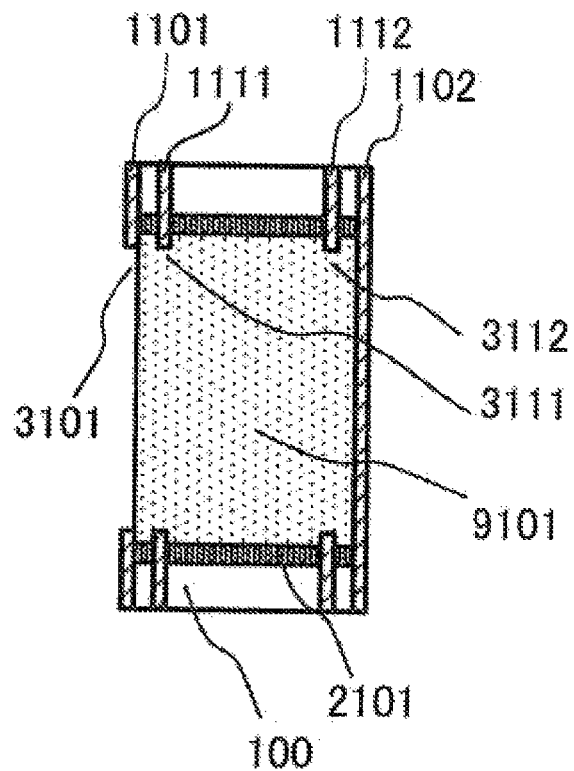
FIG. 5D is still another longitudinal sectional view taken along the line II-II' of FIG. 5A.

FIG. 5A is a top view for illustrating the connection structure for dielectric waveguides, which has related-art choke structures. FIG. 5B is a longitudinal sectional view taken along the line I-I' of FIG. 5A. FIG. 5C is another longitudinal sectional view taken along the line of FIG. 5A. Further, FIG. 5D is still another longitudinal sectional view taken along the line II-II' of FIG. 5A. In FIG. 5A to FIG. 5D, the same reference symbols as those of FIG. 1 to FIG. 3 denote the same or corresponding portions, and thus the description thereof is herein omitted.

Figure 6A:
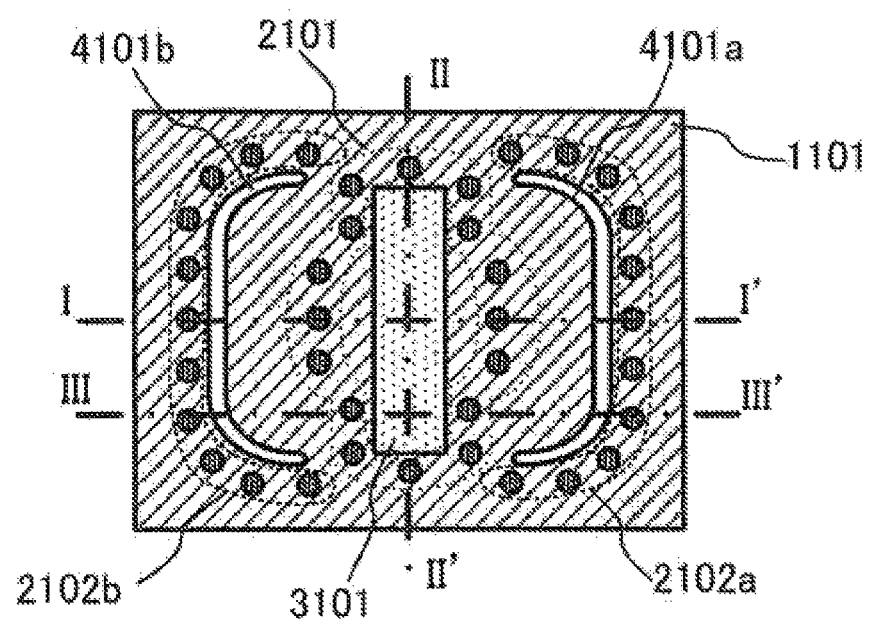
FIG. 6A is a top view for illustrating the connection structure for dielectric waveguides, which has choke structures according to the first embodiment of the present invention.
Figure 6B:
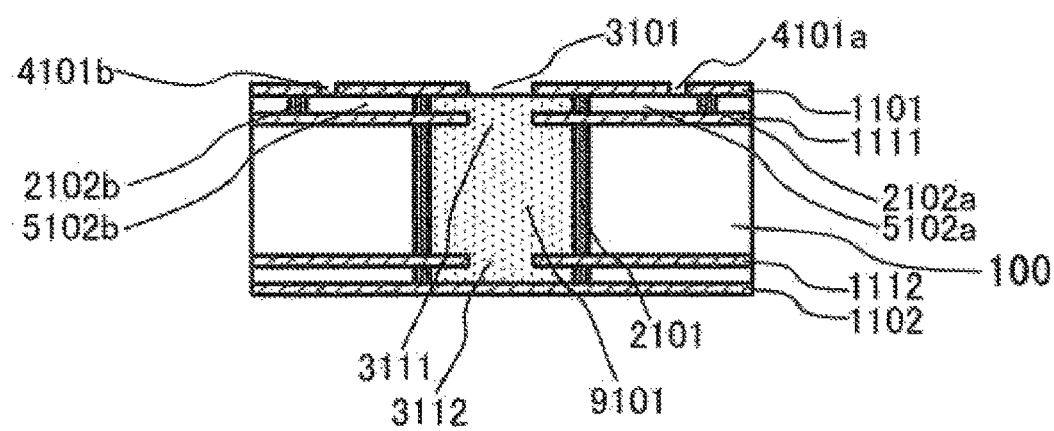
FIG. 6B is a longitudinal sectional view taken along the line I-I' of FIG. 6A.
Figure 6C:
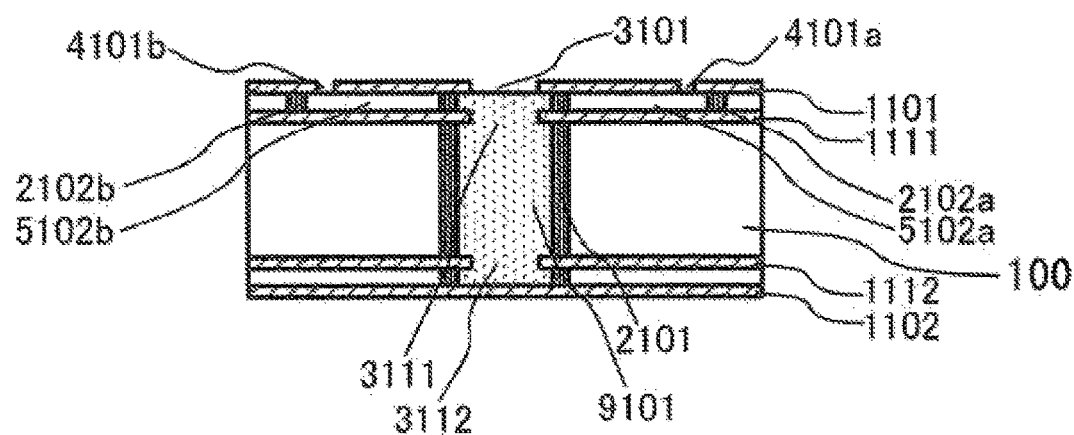
FIG. 6C is another longitudinal sectional view taken along the line III-III' of FIG. 6A.
Figure 6D:
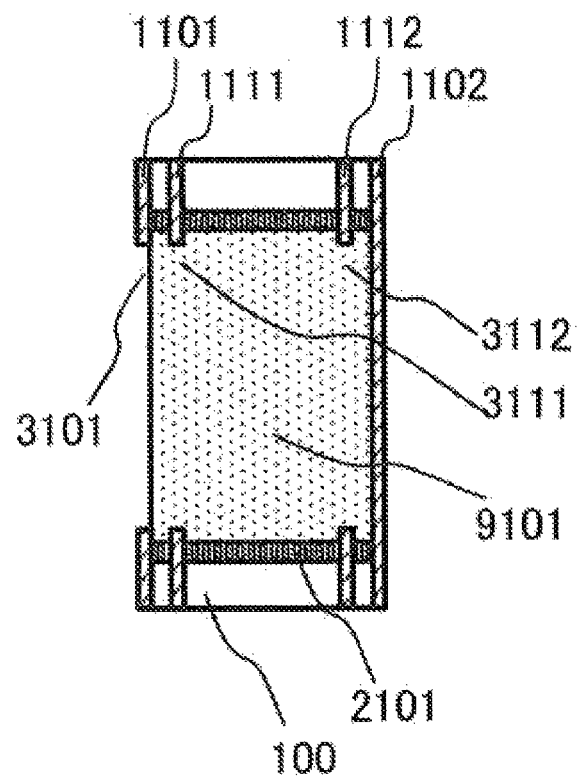
FIG. 6D is still another longitudinal sectional view taken along the line II-II' of FIG. 6A.

Meanwhile, FIG. 6A is a top view for illustrating the connection structure for dielectric waveguides, which has related-art choke structures according to the first embodiment of the present invention. FIG. 6B is a longitudinal sectional view taken along the line I-I' of FIG. 6A. FIG. 6C is another longitudinal sectional view taken along the line of FIG. 6A. Further, FIG. 6D is still another longitudinal sectional view taken along the line II-II' of FIG. 6A. In FIG. 6A to FIG. 6D, the same reference symbols as those of FIG. 1 to FIG. 3 denote the same or corresponding portions, and thus the description thereof is herein omitted.

As is apparent from comparison between FIG. 5A to FIG. 5D and FIG. 6A to FIG. 6D, in the first embodiment, a part of the conductor vias 2101, which are located in the vicinity of the center of each of the long sides of the opening 3101, is arranged on the side closer to the cutout 4101*a* or the cutout 4101*b* as shown in FIGS. 6A-6C with respect to a part of the conductor vias 2101, which are located in the vicinity of edges of each of the long sides of the opening 3101.

Specifically, in the connection structure for dielectric waveguides according to the first embodiment, as illustrated in FIG. 6A, the conductor vias 2101 are arranged in the staggered pattern. As a result, as shown in FIG. 4A and FIG. 4B, the connection structure for dielectric waveguides, which has good reflection characteristic and passage characteristic, can be achieved.

The arrangement of the conductor vias 2101 in the present invention is not limited to the staggered arrangement illustrated in FIG. 6A. For example, the conductor vias 2101, which are arranged in the vicinity of the long sides of the opening 3101, are shifted alternately toward the cutout 4101*a* or the cutout 4101*b*. With adoption of the connection structure for dielectric waveguides, in which the conductor vias 2101 are arranged in the staggered pattern, the same effects can be attained.

Figure 7A:
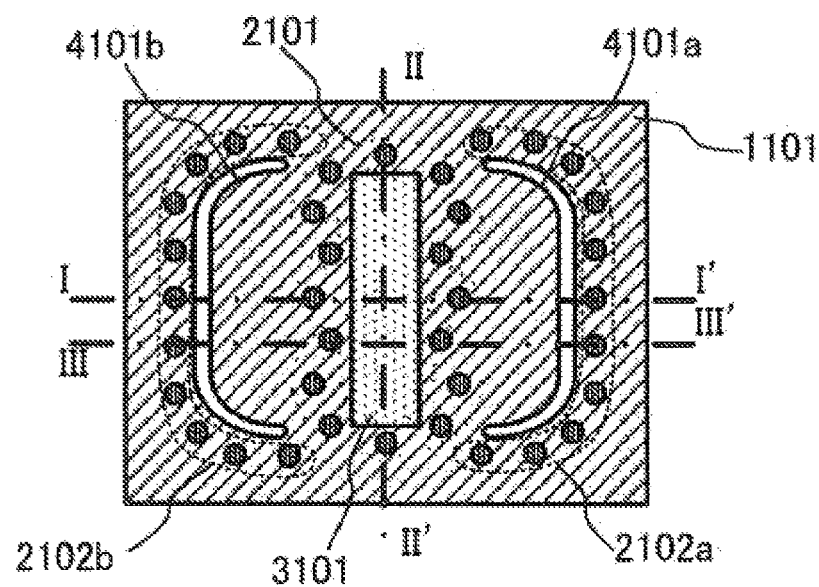
FIG. 7A is a top view for illustrating the connection structure for dielectric waveguides, which has the choke structures according to the first embodiment of the present invention.
Figure 7B:
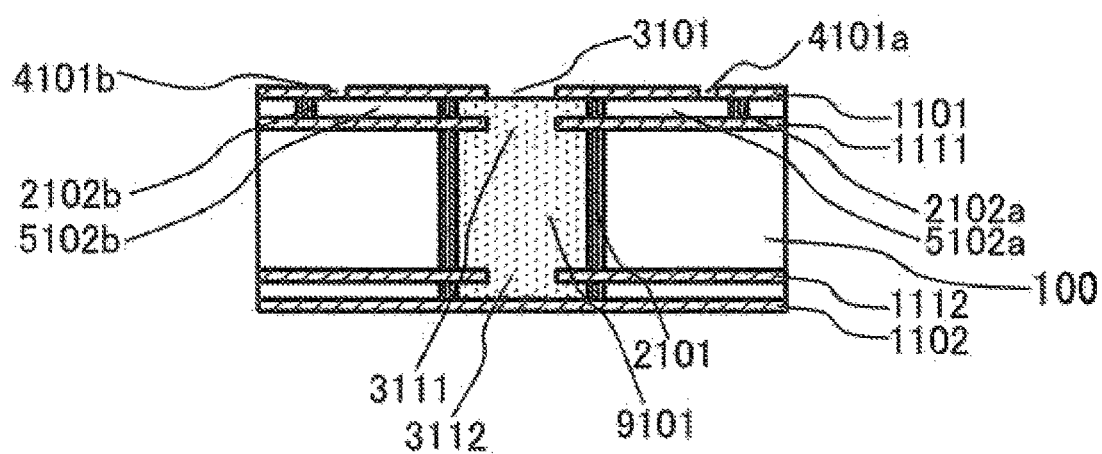
FIG. 7B is a longitudinal sectional view taken along the line I-I' of FIG. 7A.
Figure 7C:
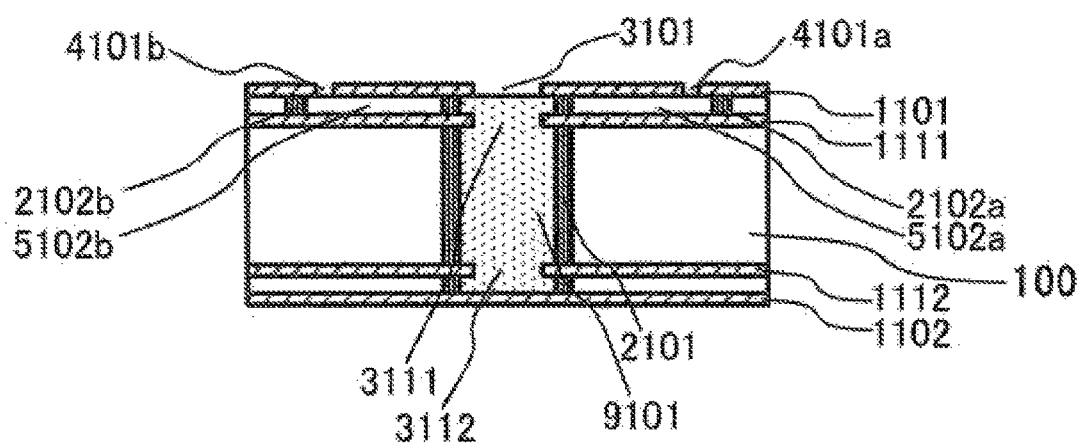
FIG. 7C is another longitudinal sectional view taken along the line III-III' of FIG. 7A.
Figure 7D:
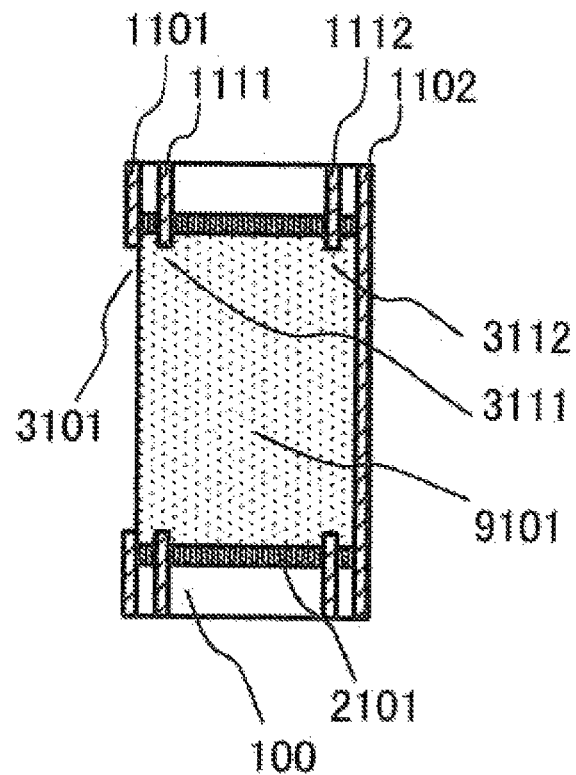
FIG. 7D is still another longitudinal sectional view taken along the line II-II' of FIG. 7A.

FIG. 7A is a top view for illustrating the connection structure for dielectric waveguides, which has choke structures according to the first embodiment of the present invention. FIG. 7B is a longitudinal sectional view taken along the line I-I' of FIG. 7A. FIG. 7C is another longitudinal sectional view taken along the line III-III' of FIG. 7A. Further, FIG. 7D is still another longitudinal sectional view taken along the line II-II' of FIG. 7A. In FIG. 7A to FIG. 7D, the same reference symbols as those of FIG. 1 to FIG. 3 denote the same or corresponding portions, and thus the description thereof is herein omitted.

In FIG. 7A to FIG. 7D, in comparison to FIG. 6A to FIG. 6D referred to above, the arrangement of the conductor vias 2101 is different. As illustrated in FIG. 7A, the conductor vias 2101 arranged in the vicinity of the long sides of the opening 3101 are arranged so as to be alternately shifted toward the cutout 4101*a* or the cutout 4101*b*.

In the example of FIG. 6A to FIG. 6D, the conductor vias 2101, which are located in the vicinity of the center of each of the long sides of the opening 3101, are arranged on the side closer to the cutout 4101*a* or the cutout 4101*b* with respect to the conductor vias 2101 adjacent thereto. Further, the conductor vias 2101 adjacent to the conductor vias 2101 located in the vicinity of the center of each of the long sides of the openings 3101 are arranged on the side closer to the opening 3101 with respect to the conductor vias 2101 located in the vicinity of the center of each of the long sides.

Meanwhile, in the example of FIG. 7A to FIG. 7D, the conductor vias 2101 are arranged in the staggered pattern, which are located on the side closer to the opening 3101, and are linearly arranged at intervals sufficiently shorter than a wavelength so as to be arranged to form the waveguide wall of the dielectric waveguide 9101 as shown in FIGS. 7A-7D. With the arrangement described above, a transmission characteristic of the dielectric waveguide 9101 is improved. At the same time, the same effects as those attained when the configuration of FIG. 6A to FIG. 6D is adopted are attained.

In the first embodiment described above as shown in FIGS. 1-2 and 6-7, there has been described the example in which the conductor vias 2101 are arranged so as to extend from the surface-layer conductor 1101 to the surface-layer conductor 1102 in the laminating direction of the multi-layer dielectric substrate 100 to form the dielectric waveguide 9101. However, the present invention is not limited to the above-mentioned configuration of the dielectric waveguide.

Figure 8A:
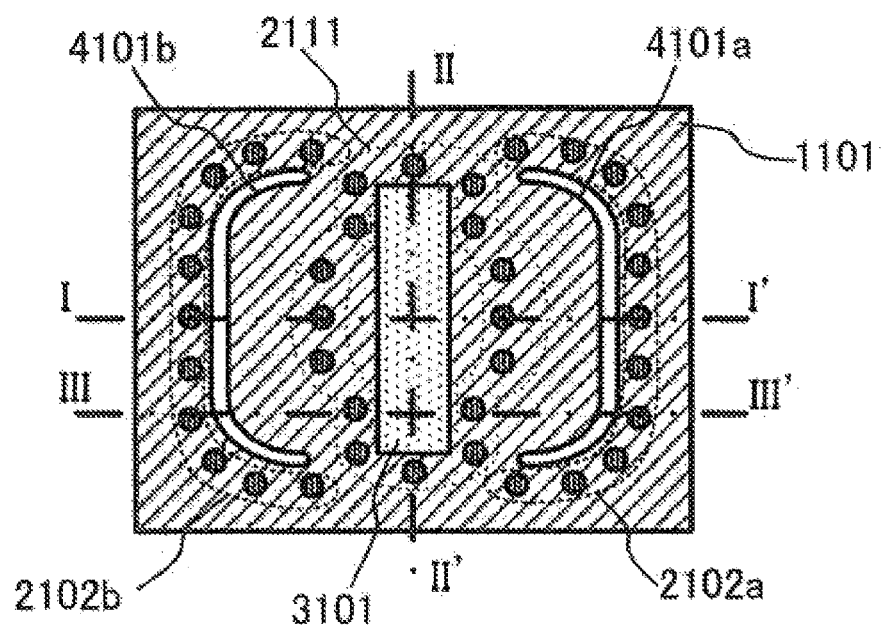
FIG. 8A is a top view for illustrating the connection structure for dielectric waveguides, which has the choke structures according to the first embodiment of the present invention.
Figure 8B:
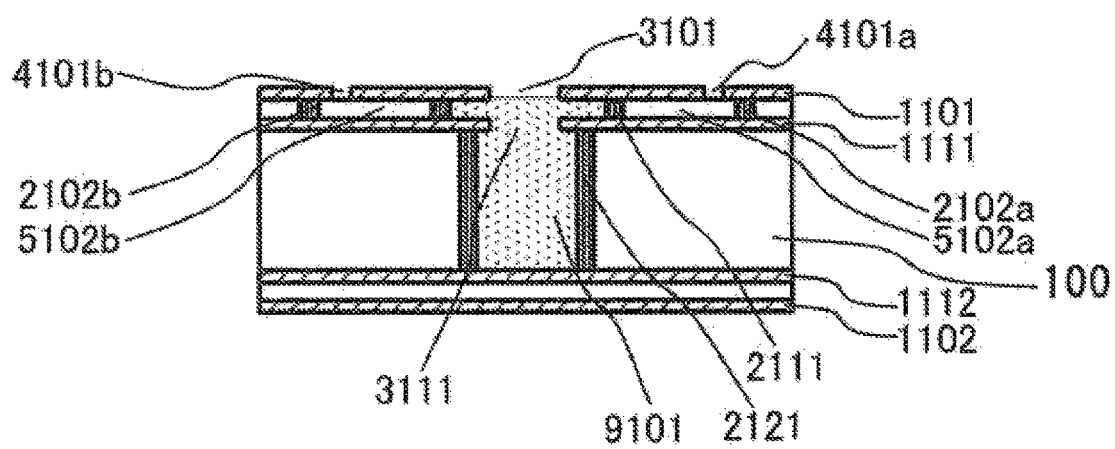
FIG. 8B is a longitudinal sectional view taken along the line I-I' of FIG. 8A.
Figure 8C:
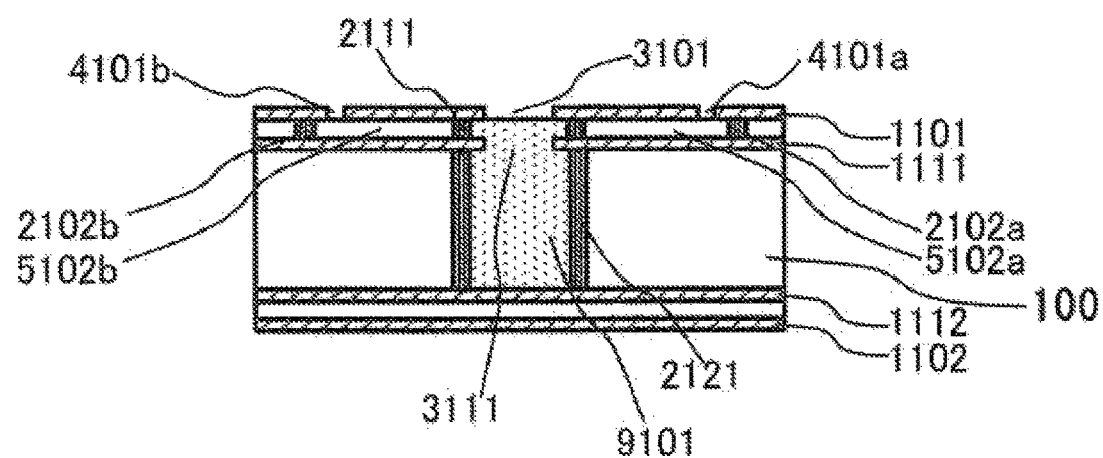
FIG. 8C is another longitudinal sectional view taken along the line III-III' of FIG. 8A.
Figure 8D:
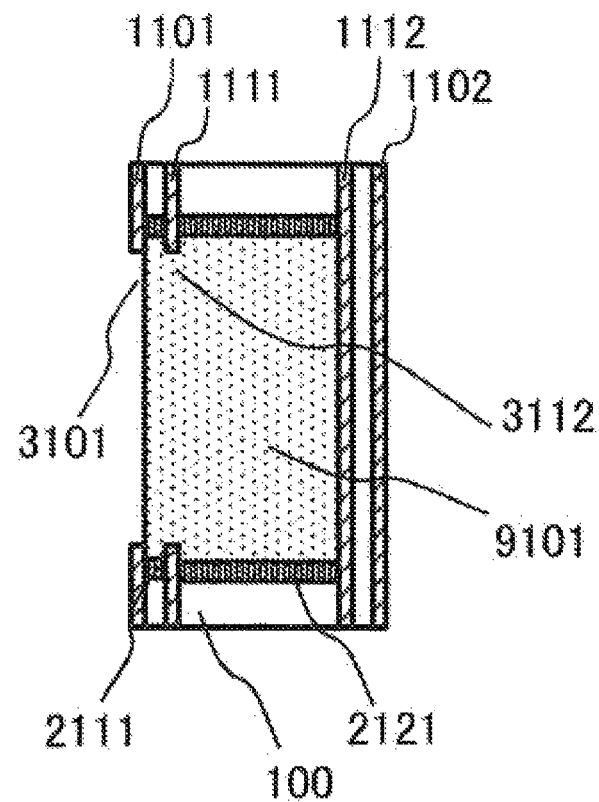
FIG. 8D is still another longitudinal sectional view taken along the line II-II' of FIG. 8A.

FIG. 8A is a top view for illustrating the connection structure for dielectric waveguides, which has related-art choke structures according to the first embodiment of the present invention. FIG. 8B is a longitudinal sectional view taken along the line I-I' of FIG. 8A. FIG. 8C is another longitudinal sectional view taken along the line III-III' of FIG. 8A. Further, FIG. 8D is still another longitudinal sectional view taken along the line II-II' of FIG. 8A. In FIG. 8A to FIG. 8D, the same reference symbols as those of FIG. 1 to FIG. 3 denote the same or corresponding portions, and thus the description thereof is herein omitted.

As illustrated in FIGS. 8A-8D, the dielectric waveguide 9101 may be formed so that the conductor vias 2111 are arranged in the staggered pattern to extend from the surface-layer conductor 1101 to the inner-layer conductor 1111 (FIGS. 8A-8D) so as to surround the opening 3101 and conductor vias 2121 are arranged to extend from the inner-layer conductor 1111 to the inner-layer conductor 1112 (FIGS. 8A-8D) so as to surround the conductor removed portion 3111 (FIGS. 8B and 8C).

In the connection structure for dielectric waveguides, which has choke structures illustrated in FIGS. 8A-8D, only the conductor vias 2111 are arranged in the staggered pattern, whereas the conductor vias 2121 (FIGS. 8A-8D) are arranged along the conductor removed portion 3111. With the arrangement described above, all the conductor vias 2121 form the waveguide wall of the dielectric waveguide 9101 (FIGS. 8A-8D). As a result, the transmission characteristic of the dielectric waveguide 9101 is improved. At the same time, the same effects as those attained in the case in which the configuration of FIG. 6A to FIG. 6D is adopted are attained.

Further, in the first embodiment described above as shown in FIGS. 3 and 6-8, there has been described the connection structure for dielectric waveguides, which has the cutout 4101a and the cutout 4101b, each being formed by removing part of the surface-layer conductor 1101 with a given width into a U-shape with angled corners. Each of the cutout 4101a and the cutout 4101b is formed so as to be spaced by λ/4 away from each of the opening edges of the opening 3101 at the position opposed to the vicinity of the center of a corresponding one of the long sides of the opening 3101 and by λ/8 or less away from a first opening edge at the position opposed to the vicinity of each of the edges of a corresponding one of the long sides of the first opening. However, the present invention is not limited to the above-mentioned configuration of the dielectric waveguide.

Figure 9A:
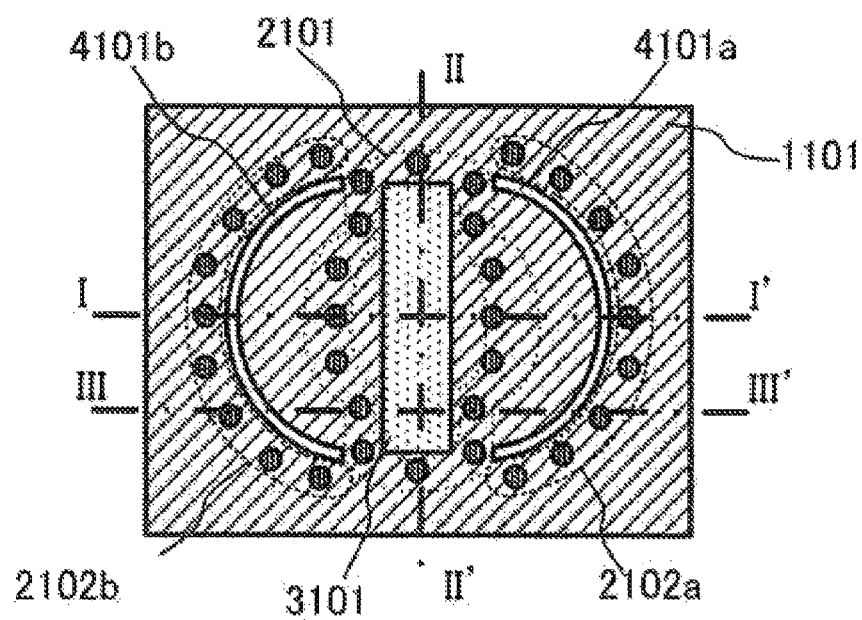
FIG. 9A is a top view for illustrating the connection structure for dielectric waveguides, which has the choke structures according to the first embodiment of the present invention.
Figure 9B:
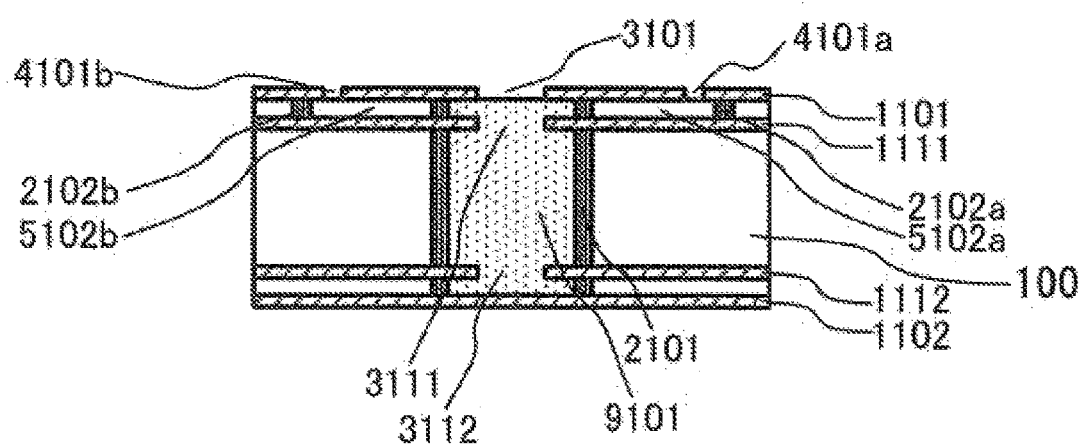
FIG. 9B is a longitudinal sectional view taken along the line I-I' of FIG. 9A.
Figure 9C:
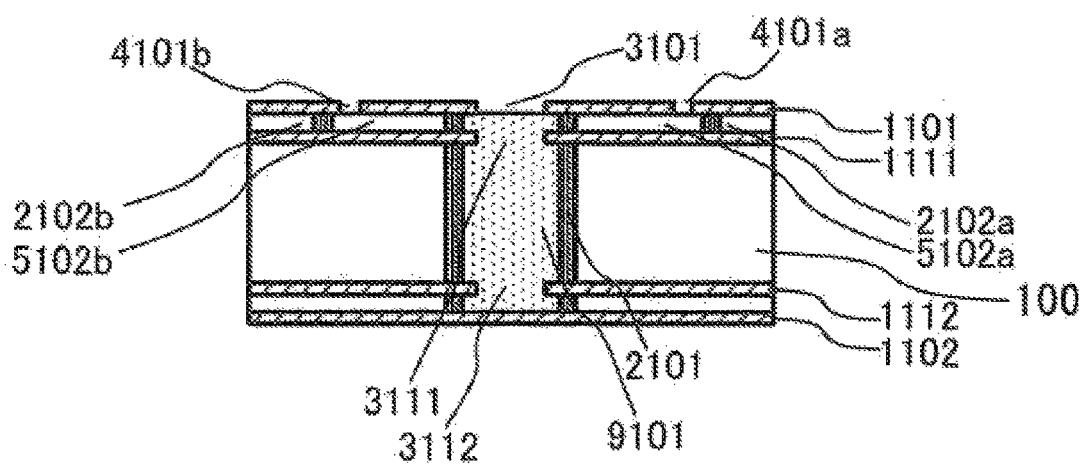
FIG. 9C is another longitudinal sectional view taken along the line III-III' of FIG. 9A.
Figure 9D:
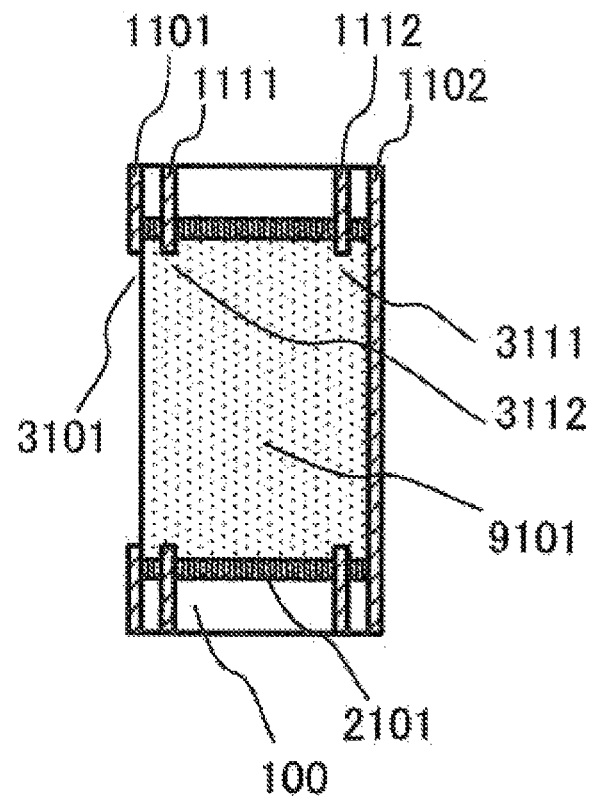
FIG. 9D is still another longitudinal sectional view taken along the line II-II' of FIG. 9A.

FIG. 9A is a top view for illustrating the connection structure for dielectric waveguides, which has choke structures according to the first embodiment of the present invention. FIG. 9B is a longitudinal sectional view taken along the line I-I' of FIG. 9A. FIG. 9C is another longitudinal sectional view taken along the line III-III' of FIG. 9A. Further, FIG. 9D is still another longitudinal sectional view taken along the line II-II' of FIG. 9A. In FIG. 9A to FIG. 9D, the same reference symbols as those of FIG. 1 to FIG. 3 denote the same or corresponding portions, and thus the description thereof is herein omitted.

Figure 10A:
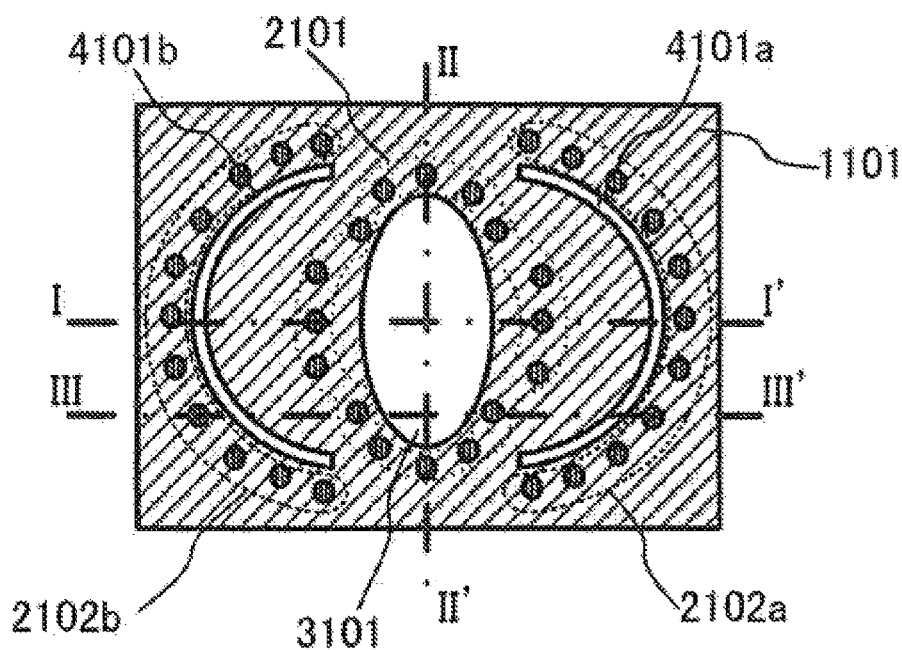
FIG. 10A is a top view for illustrating the connection structure for dielectric waveguides, which has the choke structures according to the first embodiment of the present invention.
Figure 10B:
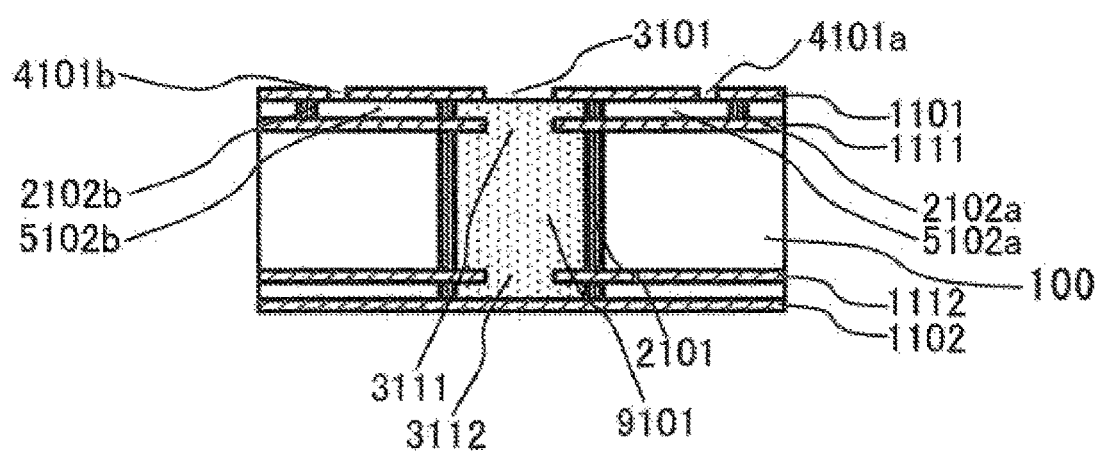
FIG. 10B is a longitudinal sectional view taken along the line I-I' of FIG. 10A.
Figure 10C:
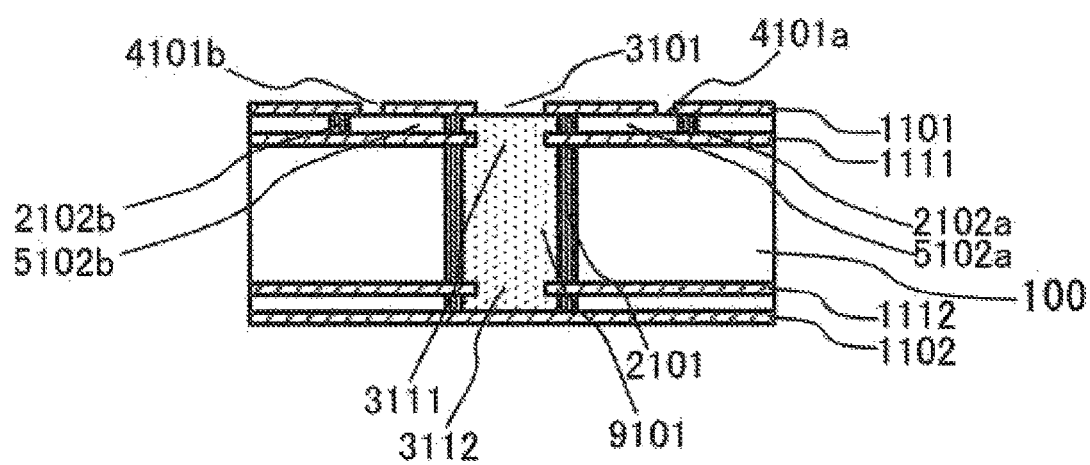
FIG. 10C is another longitudinal sectional view taken along the line III-III' of FIG. 10A.
Figure 10D:
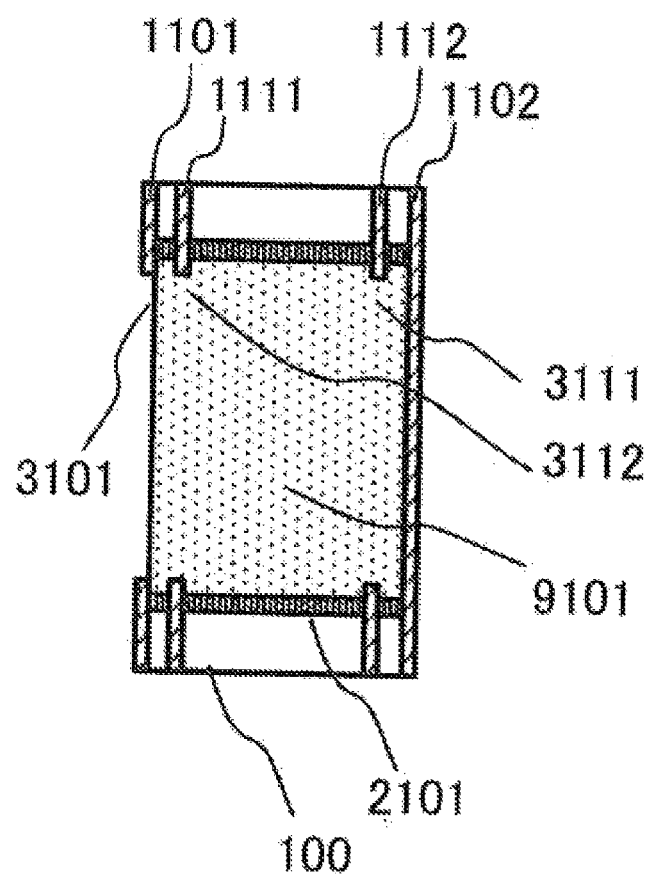
FIG. 10D is still another longitudinal sectional view taken along the line II-II' of FIG. 10A.

FIG. 10A is a top view for illustrating the connection structure for dielectric waveguides, which has choke structures according to the first embodiment of the present invention. FIG. 10B is a longitudinal sectional view taken along the line I-I' of FIG. 10A. FIG. 10C is another longitudinal sectional view taken along the line III-III' of FIG. 10A. Further, FIG. 10D is still another longitudinal sectional view taken along the line II-II' of FIG. 10A. In FIG. 10A to FIG. 10D, the same reference symbols as those of FIG. 1 to FIG. 3 denote the same or corresponding portions, and thus the description thereof is herein omitted.

As illustrated in FIG. 9A, through the formation of each of the cutout 4101a and the cutout 4101b in the U-shape with rounded corners, each of the cutout 4101a and the cutout 4101b may be formed in a U-shape with rounded corners. In the connection structure for dielectric waveguides, which has choke structures illustrated in FIGS. 9B-9C, each of the cutouts can be formed along a distribution of an electric field intensity of the high-frequency signal leaking from the space between the multi-layer dielectric substrate 100 and the multi-layer dielectric substrate 200 (FIGS. 1-2). As a result, the leakage of the high-frequency signal from the substrates can be suppressed. Thus, performance of the choke structure is improved. At the same time, the same effects as those attained when the configuration of FIG. 6A to FIG. 61) is adopted can be attained.

Further, in the first embodiment as shown in FIGS. 1-2 and FIGS. 9B-9D, a shape of each of the opening 3101, the opening 3201, the conductor removed portion 3111, the conductor removed portion 3112, the conductor removed portion 3211, and the conductor removed portion 3212 is rectangular in the example described above. However, the present invention is not limited to the configuration described above, and each of the shapes may be oval.

In the connection structure for dielectric waveguides, which has choke structures illustrated in FIGS. 10B-10C, each of the opening 3101, the conductor removed portion 3111, and the conductor removed portion 3112 has an oval shape. The conductor vias 2101 are arranged in the staggered pattern so as to surround the opening 3101 having the oval shape as shown in FIG. 10A. With the adoption of the above-mentioned configuration of the oval shape described above, the connection structure for dielectric waveguides, which has a high degree of freedom in design, is obtained. At the same time, the same effects as those attained when the configuration of FIG. 6A to FIG. 6D is adopted are attained.

SECOND EMBODIMENT

In the first embodiment described above as shown in FIGS. 1-3 and 6-10, there has been described the connection structure for dielectric waveguides, in which the opening 3101, the opening 3201, the conductor removed portion 3111, the conductor removed portion 3112, the conductor removed portion 3211, and the conductor removed portion 3212 have the same opening dimension. However, the present invention is not limited to the connection structure described above, and the opening dimensions may be different in the connection structure for dielectric waveguides.

Figure 11:
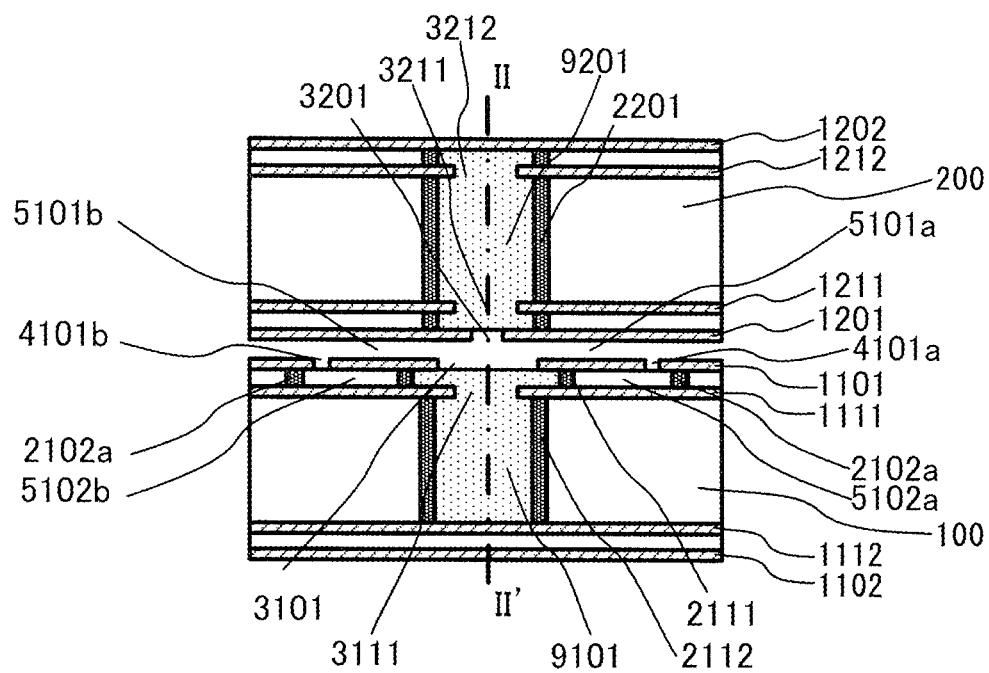
FIG. 11 is a longitudinal sectional view for illustrating a connection structure for dielectric waveguides according to a second embodiment of the present invention.
Figure 12:
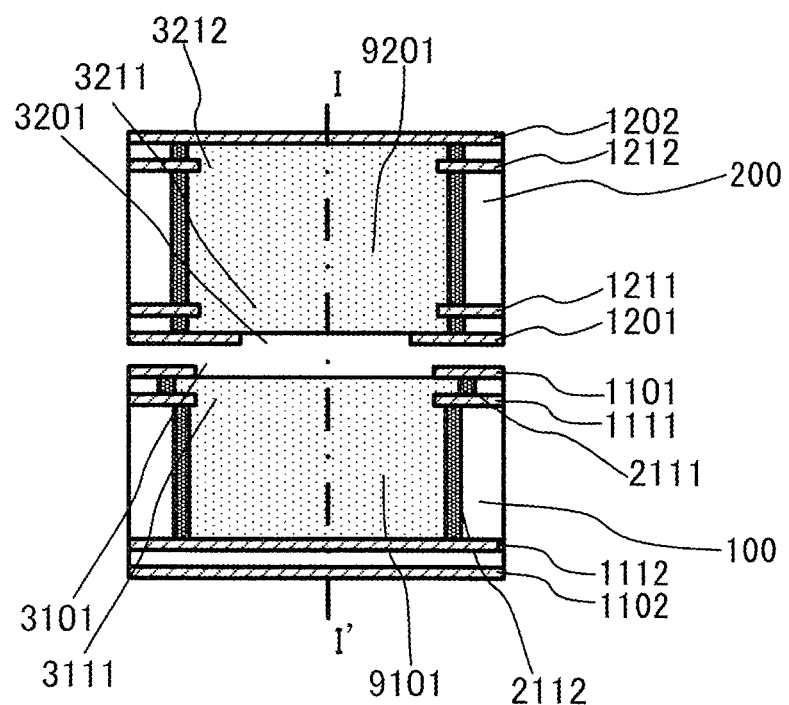
FIG. 12 is another longitudinal sectional view taken along the line II-II' of FIG. 11 in the second embodiment of the present invention.

FIG. 11 is a longitudinal sectional view for illustrating a connection structure for dielectric waveguides according to a second embodiment of the present invention, which corresponds to a longitudinal sectional view taken along the line I-I' of FIG. 12. FIG. 12 is another longitudinal sectional view taken along the line II-II' of FIG. 11 in the second embodiment of the present invention. Further, FIG. 3 is an exploded perspective view for illustrating conductor layers and conductor vias of FIG. 11 in the second embodiment of the present invention.

Figure 13:
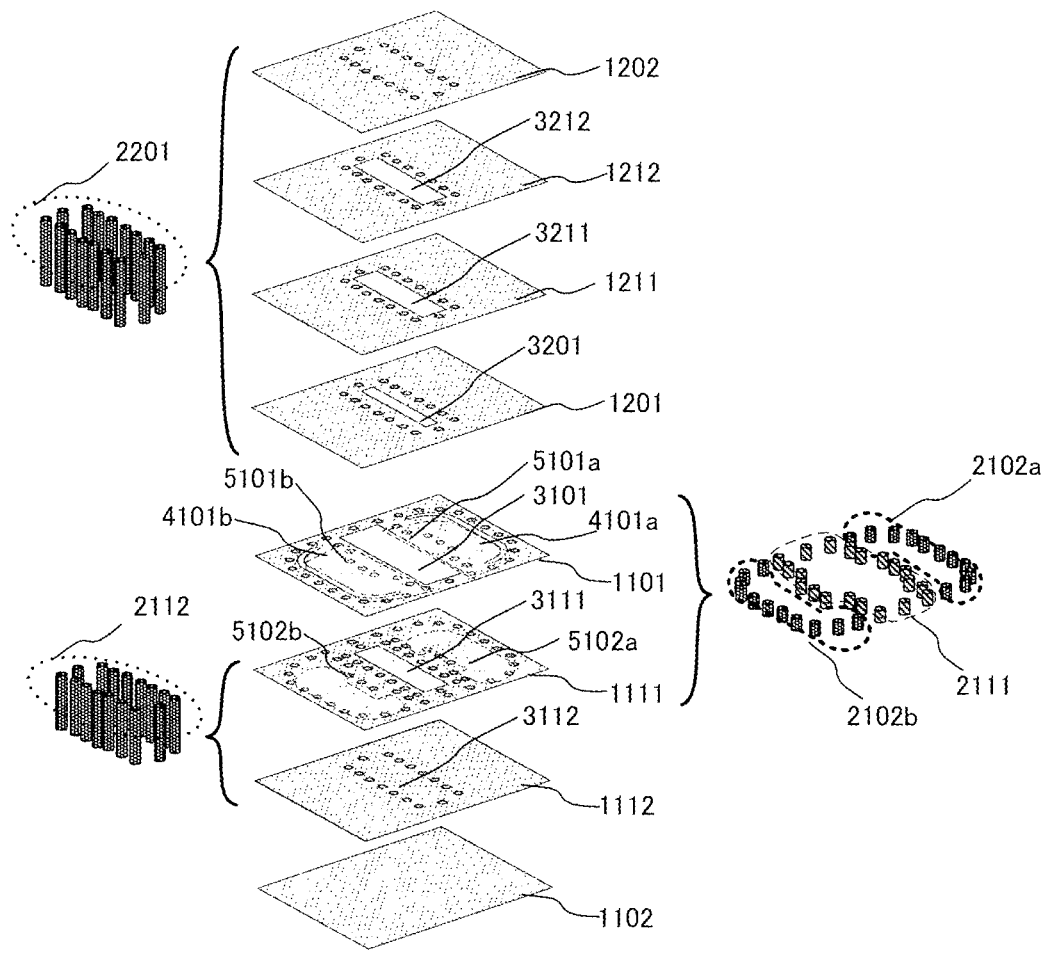
FIG. 13 is an exploded perspective view for illustrating conductor layers and conductor vias of FIG. 11 in the second embodiment of the present invention.

In FIG. 11 to FIG. 13, the same reference symbols as those of FIG. 1 to FIG. 3 denote the same or corresponding portions, and the description thereof is herein omitted. Other configurations are described separately.

In FIG. 11, a plurality of the conductor vias 2111 are arranged so as to surround the opening 3101 and pass through the multi-layer dielectric substrate 100 from the the inner-layer conductor 1101 to the inner-layer conductor 1111.

A plurality of the conductor vias 2112 are arranged so as to surround the conductor removed portion 3111 and pass through the multi-layer dielectric substrate 100 from the the inner-layer conductor 1111 to the inner-layer conductor 1112.

A part of the conductor vias 2111 is arranged at a position spaced by λe/4 away from the cutout 4101a toward the opening 3101. Meanwhile, a part of the conductor vias 2111 is arranged at a position spaced by λe/4 away from the cutout 4101b toward the opening 3101. As a result, the conductor vias 2111 are arranged in a staggered pattern.

The opening dimension of the opening 3101 in the second embodiment is larger than the opening dimension of the opening 3201. The opening dimension of each of the conductor removed portion 3111, the conductor removed portion 3211, and the conductor removed portion 3212 is smaller than that of the opening 3101 and larger than that of the opening 3201.

The inner-layer conductor 1112 in the second embodiment does not have a conductor removed portion, and serves as a short-circuited surface of the dielectric waveguide 9101.

According to the second embodiment, the opening dimension of the opening 3101 is set larger than that of the opening 3201. The opening dimension of each of the conductor removed portion 3111, the conductor removed portion 3211, and the conductor removed portion 3212 is set smaller than that of the opening 3101 and larger than that of the opening 3201. With the configuration described above, characteristic deterioration, which may be caused due to a misalignment between the multi-layer dielectric substrate 100 and the multi-layer dielectric substrate 200, can be allowed.

Further, according to the second embodiment, the opening dimension is locally changed for the opening 3201 in the dielectric waveguide 9201 so as to be different from the opening dimension of the opening 3101 in the dielectric waveguide 9101. With the adoption of the configuration described above, influences of the connection between the lines having different impedances at a connecting portion between the dielectric waveguides, which are generated along with change in opening dimension, can be minimized. At the same time, the same effects as those of the first embodiment described above are attained.

Third Embodiment

In the first embodiment and the second embodiment described above, there has been described the connection structure for dielectric waveguides, in which air is present in a space between the surface-layer conductor 1101 of the multi-layer dielectric substrate 100 and the surface-layer conductor 1201 of the multi-layer dielectric substrate 200. Meanwhile, in the third embodiment, there is described a connection structure for dielectric substrates, in which a dielectric is arranged in the space.

Figure 14:
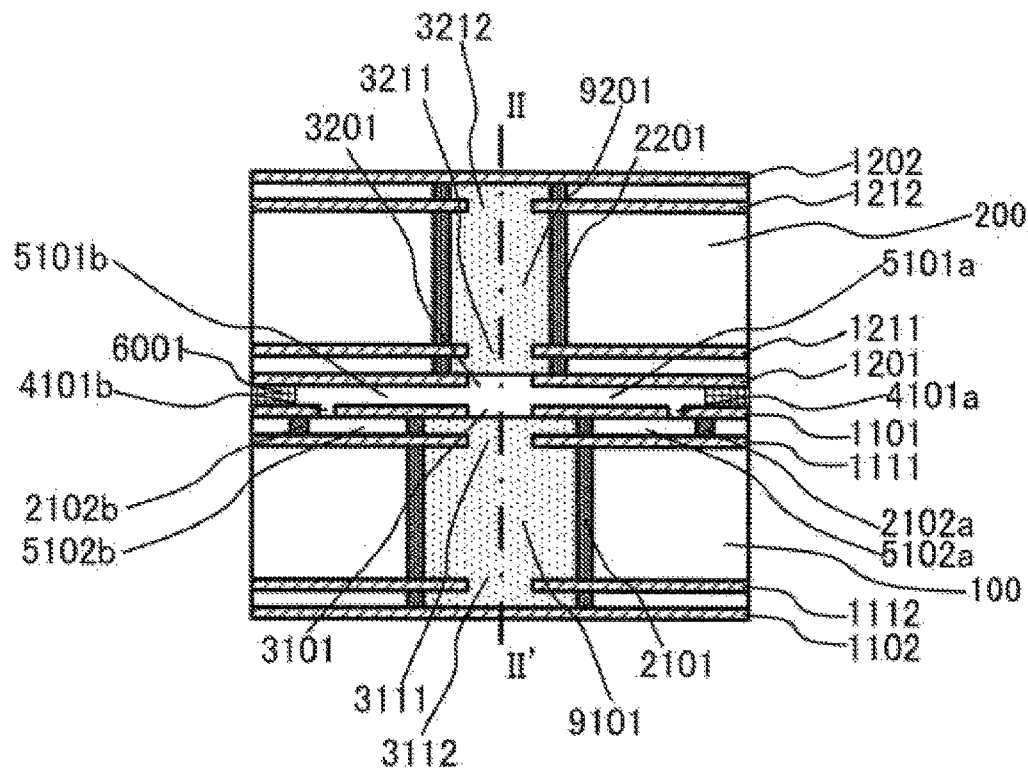
FIG. 14 is a longitudinal sectional view for illustrating a connection structure for dielectric waveguides according to a third embodiment of the present invention.
Figure 15:
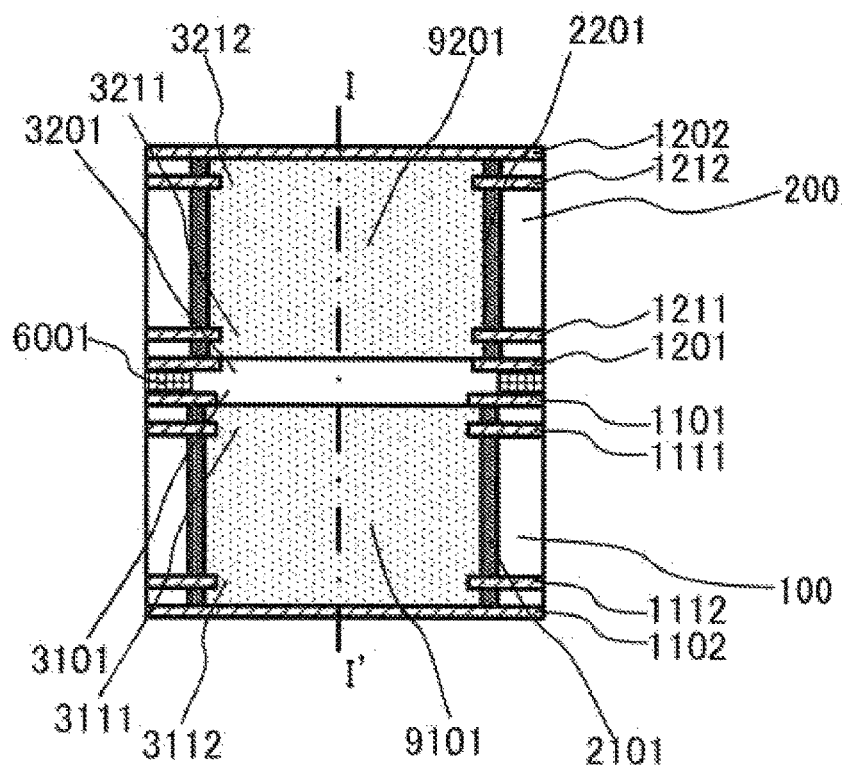
FIG. 15 is another longitudinal sectional view taken along the line II-II' of FIG. 14 in the third embodiment of the present invention.

FIG. 14 is a longitudinal sectional view for illustrating a connection structure for dielectric waveguides according to a third embodiment of the present invention, which corresponds to a longitudinal sectional view taken along the line I-I' of FIG. 15. FIG. 15 is another longitudinal sectional view taken along the line II-II' of FIG. 14 in the third embodiment of the present invention. Further, FIG. 16 is an exploded perspective view for illustrating conductor layers, conductor vias, and a sheet-shaped dielectric of FIG. 14 in the third embodiment of the present invention.

Figure 16:
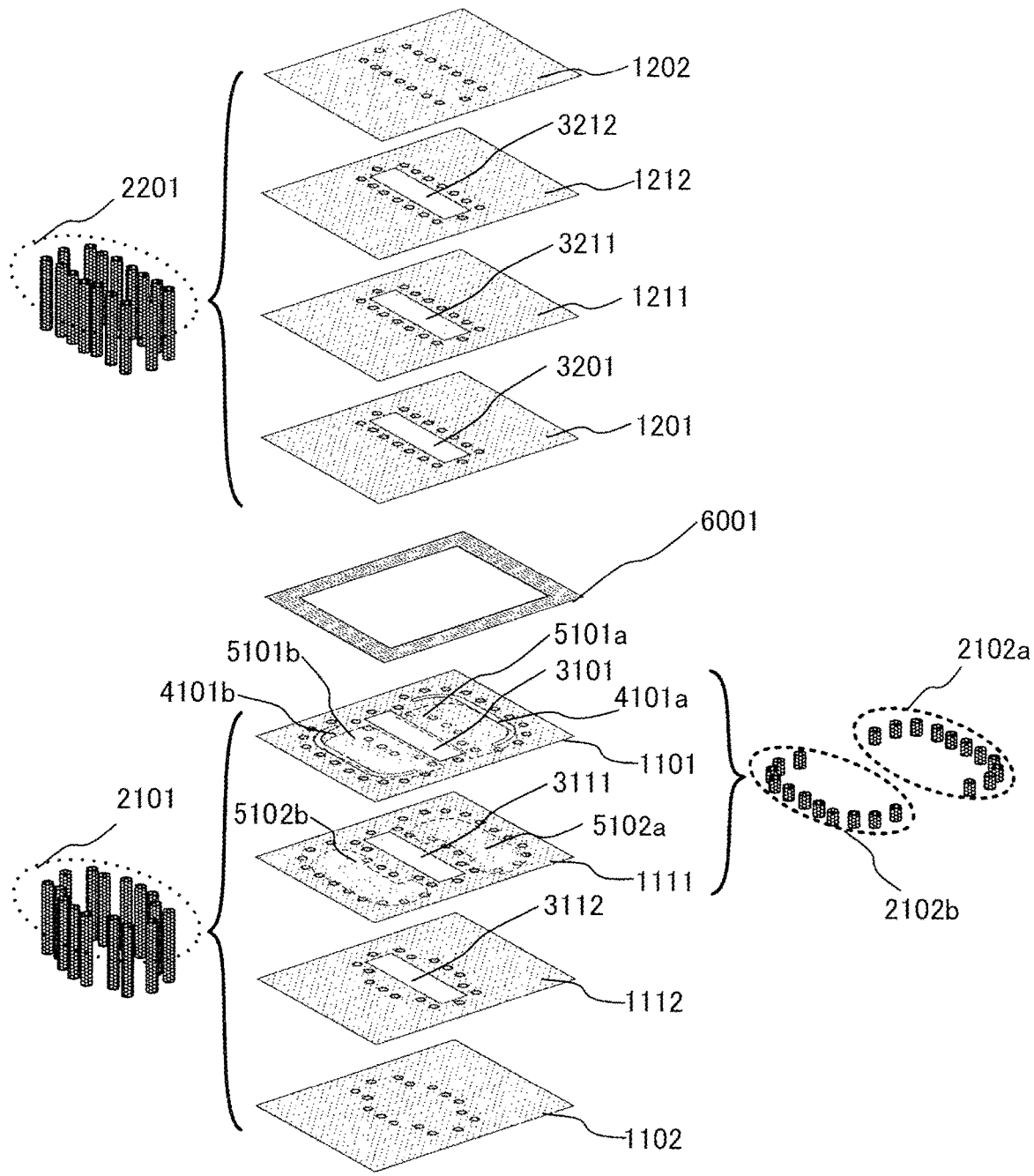
FIG. 16 is an exploded perspective view for illustrating conductor layers, conductor vias, and a sheet-shaped dielectric of FIG. 14 in the third embodiment of the present invention.

In FIG. 14 to FIG. 16, the same reference symbols as those of FIG. 1 to FIG. 3 denote the same or corresponding portions, and the description thereof is herein omitted. Other configurations are described separately.

In FIG. 14, a sheet-shaped dielectric 6001 is arranged in a region of the space between the surface-layer conductor 1101 of the multi-layer dielectric substrate 100 (FIGS. 14-15) and the surface-layer conductor 1201 of the multi-layer dielectric substrate 200 (FIGS. 14-15) other than regions in which the opening 3101, the choke passage 5101b (FIGS. 14-15), and the choke passage 5101b (FIGS. 14-15) are formed.

According to the third embodiment, with the adoption of the sheet-shaped dielectric 6001 arranged as described above, the surface-layer conductor 1101 of the multi-layer dielectric substrate 100 can be protected.

With the use of air in the regions in which the opening 3101, the choke passage 5101a, and the choke passage 5101b are formed, a fluctuation in electrical length in the choke passage 5101a and the choke passage 5101b, which may be caused by a misalignment between the multi-layer dielectric substrate 100 and the multi-layer dielectric substrate 200, can be minimized in comparison to a case in which the above-mentioned regions are formed as dielectrics. As a result, the characteristic deterioration in the choke structures can be minimized. At the same time, the same effects as those attained in the first embodiment described above are attained.

In the embodiments described above, the term "staggered pattern" is used to collectively, represent the arrangement of the conductor vias 2101 or the conductor vias 2111, which is illustrated in FIG. 6 to FIG. 10. For technical supplemental description, the term "staggered pattern" represents a state in which a part of the conductor vias 2101 or 2111 (corresponding to first conductor columns) is arranged at the position spaced by λe/4 away from the cutout 4101 (corresponding to a first cutout shown in FIGS. 6A-6C) toward the opening 3101 (corresponding to a first opening portion).

When each of the opening 3101 (corresponding to the first opening portion) and the opening 3201 (corresponding to a second opening portion) is formed in the rectangular shape, it is desired that a short-side length be formed as a length equal to or smaller than one-half of a long-side length. When each of the opening 3101 and the second opening 3201 is formed in the oval shape, it is desired that a short-axis length be formed as a length equal to or smaller than one-half of a long-axis length. With the adoption of the desirable structure described above, a high-order transmission mode can be generated in a frequency band higher than an operating band. Thus, a basic transmission mode alone is used as a transmission mode in the operating band. Thus, a good passage characteristic can be achieved.

A free combination of the embodiments, a modification of a suitable component in each of the embodiments, or omission of a suitable component in each of the embodiments is possible in the present invention within the scope of the invention.

REFERENCE SIGNS LIST 100, 200 multi-layer dielectric substrate; 1101, 1102, 1201, 1202 surface-layer conductor; 1111, 1112, 1211, 1212 inner-layer conductor; 2101, 2102a, 2102b, 2201, 2202a, 2202b, 2111, 2112 conductor via; 3101, 3201 opening; 3111, 3112, 3211, 3212 conductor removed portion; 4101a, 4101b cutout; 5101a, 5101b, 5102a, 5102b choke passage; 9101, 9201 dielectric waveguide; 6001 sheet-shaped dielectric

The invention claimed is:

1. A connection structure for dielectric waveguides, comprising:
a first multi-layer dielectric substrate, which includes a first dielectric waveguide having a first opening portion, and is configured to propagate a high-frequency signal therethrough; and
a second multi-layer dielectric substrate, which includes a second dielectric waveguide having a second opening portion, is arranged to be opposed to the first multi-layer dielectric substrate so that the first opening portion and the second opening portion are opposed to each other through a first space therebetween, and is configured to propagate the high-frequency signal therethrough,
wherein the first multi-layer dielectric substrate includes:
a first surface-layer conductor, which is provided so as to cover a surface of the first multi-layer dielectric substrate, the surface being opposed to the second multi-layer dielectric substrate, has the first opening portion formed therethrough, and has first cutouts formed at two positions spaced by $\lambda/4$ away from edges of the first opening portion so as to be opposed to each other through the first opening portion therebetween;
a first inner-layer conductor, which is provided in the first multi-layer dielectric substrate so as to be opposed to the first surface-layer conductor, and has a first conductor removed portion formed at a position opposed to the first opening portion; and
a plurality of first conductor columns, which are provided to extend from the first surface-layer conductor through the first inner-layer conductor in a laminating direction of the first multi-layer dielectric substrate so as to surround all sides of a perimeter of the first opening portion, and are arranged so as to form a waveguide wall of the first dielectric waveguide,
wherein the first multi-layer dielectric substrate has choke structures at two positions opposed to each other through the first opening portion therebetween,
wherein the choke structures include first choke passages, each having a length of $\lambda/4$, and second choke passages, each having a length of $\lambda e/4$,
wherein each of the first choke passages is formed as a space from each of the edges of the first opening portion to a corresponding one of the first cutouts in the first space,
wherein each of the second choke passages is formed as a space surrounded by a plurality of third conductor columns provided along an edge of each of the first cutouts, which is on a side opposite to a side on which the first dielectric waveguide is located, so as to connect the first surface-layer conductor and the first inner-layer conductor and the first conductor columns in a second space between the first surface-layer conductor and the first inner-layer conductor,
wherein a part of the first conductor columns is arranged at a position spaced by $\lambda e/4$ away from each of the first cutouts toward the first opening portion, in which $\lambda$ is a free-space wavelength of a signal wave, and $\lambda e$ is an effective wavelength in the dielectric substrates.

2. The connection structure for dielectric waveguides according to claim 1, wherein each of the first opening portion and the second opening portion is formed in a rectangular shape so that a short-side length of each of the first opening portion and the second opening portion in a short-axis direction is formed to be one-half or smaller of a long-side length of each of the first opening portion and the second opening portion in a long-axis direction.

3. The connection structure for dielectric waveguides according to claim 1, wherein each of the first opening portion and the second opening portion is formed in an oval shape so that a short-axis length of each of the first opening portion and the second opening portion in a short-axis direction is formed to be one-half or smaller of a long-axis length of each of the first opening portion and the second opening portion in a long-axis direction.

4. The connection structure for dielectric waveguides according to claim 1, wherein each of the first cutouts is formed in a U-shape with rounded corners through removal of part of the first surface-layer conductor with a given width so as to be spaced by $\lambda/4$ away from each of the edges of the first opening portion at a position opposed to a center of the first opening portion in the long-axis direction and so as to be spaced by $\lambda/8$ or less away from each of the edges of the first opening portion at positions opposed to edges of the first opening portion in the long-axis direction.

5. The connection structure for dielectric waveguides according to claim 1, wherein the first opening portion has an opening area larger than each of an opening area of the second opening portion and an opening area of the first conductor removed portion.

6. The connection structure for dielectric waveguides according to claim 1,
wherein the second multi-layer dielectric substrate includes:
a second surface-layer conductor provided so as to cover a surface of the second multi-layer dielectric substrate, which is opposed to the first multi-layer dielectric substrate; and
a second inner-layer conductor, which is provided in the second multi-layer dielectric substrate so as to be opposed to the second surface-layer conductor, and has a second conductor removed portion formed at a position opposed to the second opening portion, and
wherein the second opening portion has an opening area smaller than each of an opening area of the second conductor removed portion and an opening area of the first conductor removed portion.

7. The connection structure for dielectric waveguides according to claim 1,
wherein the first multi-layer dielectric substrate further includes a first short-circuit conductor arranged so as to be opposed to a surface opposite to a surface on which the first surface-layer conductor is provided with respect to the first inner-layer conductor, and wherein a plurality of fourth conductor columns are provided to pass from the first inner-layer conductor to the first short-circuit conductor so as to surround the first conductor removed portion.

8. The connection structure for dielectric waveguides according to claim 1, wherein a dielectric is provided in a region of the first space other than regions in which the first opening portion and the first choke passages are formed.

* * * * *